(12) United States Patent
Truong

(10) Patent No.: US 10,331,103 B2
(45) Date of Patent: Jun. 25, 2019

(54) HYSTERESIS CONTROL SYSTEMS AND METHODS FOR PROGRAMMABLE LOGIC DEVICES

(71) Applicant: Lattice Semiconductor Corporation, Portland, OR (US)

(72) Inventor: Keith Truong, San Jose, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 16/020,955

(22) Filed: Jun. 27, 2018

(65) Prior Publication Data
US 2019/0004494 A1 Jan. 3, 2019

Related U.S. Application Data

(60) Provisional application No. 62/526,977, filed on Jun. 29, 2017.

(51) Int. Cl.
| | | |
|---|---|---|
| H03K 19/177 | (2006.01) | |
| G05B 19/05 | (2006.01) | |
| H03K 19/0185 | (2006.01) | |

(52) U.S. Cl.
CPC ... *G05B 19/054* (2013.01); *H03K 19/018521* (2013.01); *H03K 19/17744* (2013.01); *H03K 19/17784* (2013.01)

(58) Field of Classification Search
None
See application file for complete search history.

(56) References Cited

U.S. PATENT DOCUMENTS

| | | | | |
|---|---|---|---|---|
| 6,163,190 A | * | 12/2000 | Takai | H03K 3/012 327/131 |
| 6,300,810 B1 | * | 10/2001 | Hardee | G11O 5/147 327/206 |

(Continued)

OTHER PUBLICATIONS

Maxim Integrated, "Adding Extra Hysteresis to Comparators," Application Note 3616, Sep. 19, 2005, retrieved on Jun. 18, 2018, 9 Pages [online]. Retrieved from the Internet: <https://www.maximintegrated.com/en/app-notes/index.mvp/id/3616>.

(Continued)

*Primary Examiner* — Minh D A
*Assistant Examiner* — James H Cho
(74) *Attorney, Agent, or Firm* — Haynes and Boone, LLP

(57) ABSTRACT

Various techniques are provided to implement hysteresis control for programmable logic devices (PLDs). In one example, a PLD includes a hysteresis control circuit configured to generate a hysteresis control signal based on a core voltage and an input/output (I/O) voltage. The PLD further includes an I/O cell associated with an I/O fabric of the PLD and powered by the I/O voltage. The I/O cell includes a first buffer circuit configured to receive an input voltage and generate a first buffer voltage based on the input voltage. The I/O cell further includes a hysteresis generator configured to generate a hysteresis voltage based on the hysteresis control signal and the I/O voltage. The I/O cell further includes a second buffer circuit configured to generate a second buffer voltage based on the first buffer voltage and the hysteresis voltage. Related methods and systems are provided.

20 Claims, 9 Drawing Sheets

(56) References Cited

U.S. PATENT DOCUMENTS

| | | | | |
|---|---|---|---|---|
| 6,870,413 | B1* | 3/2005 | Chang | H03K 3/3565 |
| | | | | 327/205 |
| 8,324,934 | B1 | 12/2012 | Truong et al. | |
| 2005/0264334 | A1* | 12/2005 | Yoneda | H03K 3/0375 |
| | | | | 327/205 |

OTHER PUBLICATIONS

Wikipedia, "Schmitt trigger," retrieved on Jun. 13, 2018, 10 Pages [online]. Retrieved from the Internet: <https://en.wikipedia.org/wiki/Schmitt_trigger>.

* cited by examiner

HYSTERESIS CONTROL SYSTEMS AND METHODS FOR PROGRAMMABLE LOGIC DEVICES

CROSS-REFERENCE TO RELATED APPLICATIONS

This application claims priority to and the benefit of U.S. Provisional Patent Application No. 62/526,977 filed Jun. 29, 2017 and entitled "Methods and Systems for LVCMOS Hysteresis," which is hereby incorporated by reference in its entirety.

TECHNICAL FIELD

The present invention relates generally to programmable logic devices and, more particularly, to hysteresis control techniques for such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources, including by way of non-limiting example programmable logic gates, look-up tables (LUTs), embedded hardware, interconnections, and/or other types of resources, available in particular PLDs. Physical placement and routing for the synthesized and mapped user designs may then be determined to generate configuration data for the particular PLDs. The generated configuration data is loaded into configuration memory of the PLDs to implement the programmable logic gates, LUTs, embedded hardware, interconnections, and/or other types of configurable resources.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
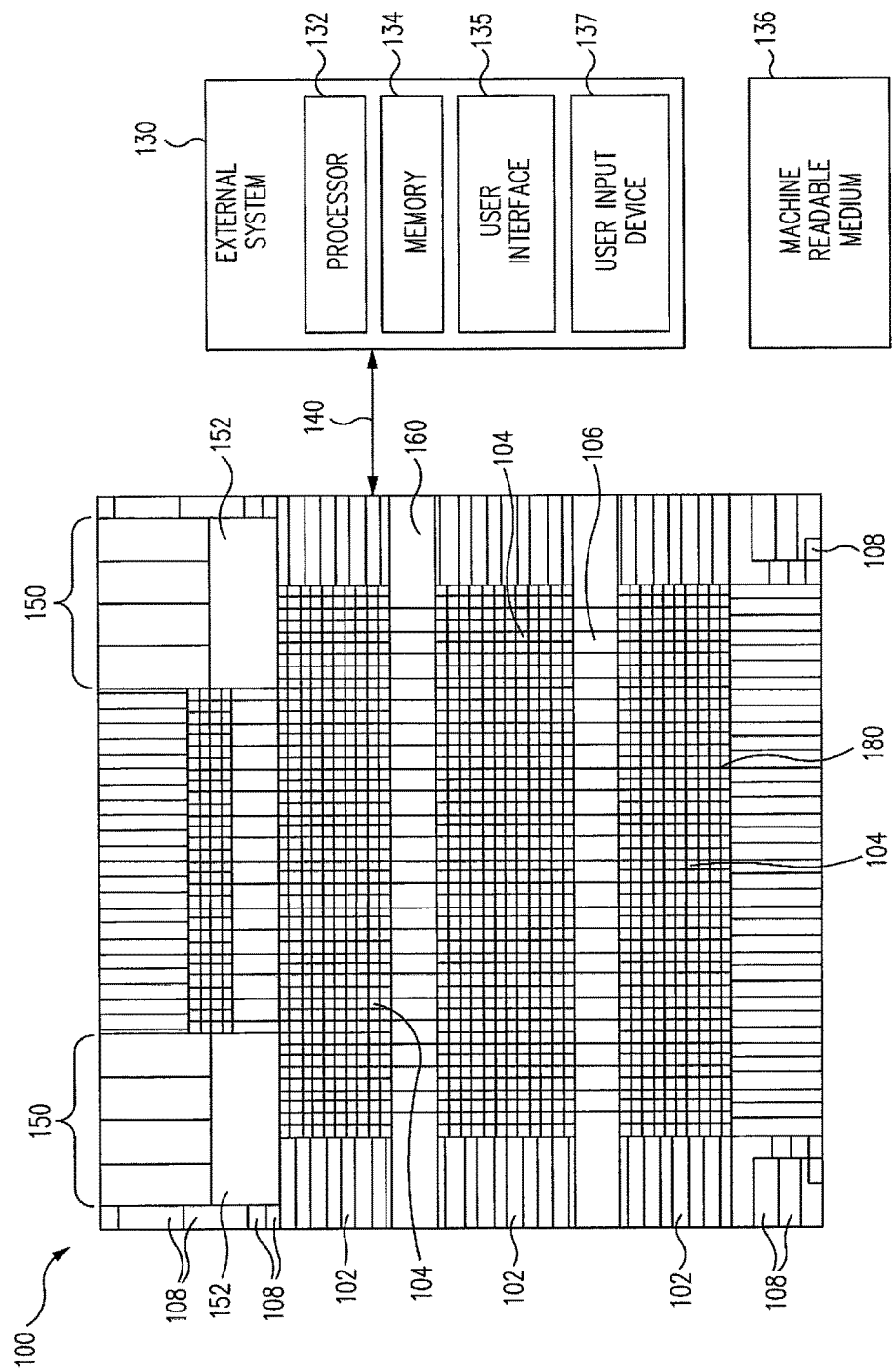
FIG. 1 illustrates a block diagram of a PLD in accordance with an embodiment of the disclosure.

Various techniques are provided to facilitate hysteresis control for PLDs. A PLD may include a logic fabric operated (e.g., powered) using a core power supply $V_{CC}$ and an input/output (I/O) fabric operated using one or more I/O power supplies $V_{CCIO}$. In some embodiments, a PLD may be implemented with hysteresis control for input buffers of I/O cells of the PLD to facilitate communication of the PLD (e.g., with external devices) using different signaling schemes having various voltage levels. In some cases, different I/O cells may be operated using different $V_{CCIO}$ voltage levels.

Trip points (e.g., also referred to as switching thresholds) of the input buffers may be defined by a high-to-low transition voltage $V_{H2L}$ and a low-to-high transition voltage $V_{L2H}$. In one example, without applying hysteresis, the trip points $V_{H2L}$ and $V_{L2H}$ may be set to a voltage level midway between the I/O voltage $V_{CCIO}$ and ground. In these cases, for example, when $V_{CCIO}$=3.3 V, $V_{H2L}$=$V_{L2H}$=1.65 V. As such, a transition from a low state (e.g., also referred to as a logic low) to a high state (e.g., also referred to as a logic high) for the input buffer may occur in response to a voltage greater than 1.65 V and transition from the high state to the low state in response to a voltage less than 1.65 V.

Hysteresis may be applied to the input buffers of the I/O cells to mitigate system noise and/or fluctuations in the $V_{CCIO}$ and/or $V_{CC}$ levels by moving trip points associated with the input buffers. In some embodiments, by applying hysteresis, the trip points $V_{H2L}$ and/or $V_{L2H}$ may be moved apart from each other. With continuing reference to the above example in which $V_{H2L}$=$V_{L2H}$=$V_{CCIO}$/2=1.65 V without hysteresis, the hysteresis may adjust the trip point $V_{H2L}$ such that $V_{H2L}$>1.65 V and/or adjust the trip point $V_{L2H}$ such that $V_{L2H}$<1.65 V. As such, with the hysteresis, transitioning of an input buffer from low-to-high and high-to-low due to system noise and/or fluctuations in the $V_{CCIO}$ and/or $V_{CC}$ levels may be reduced or eliminated.

In some embodiments, the PLD may include hysteresis control circuits and hysteresis generators. The hysteresis control circuits may generate hysteresis control signals (e.g., hysteresis control voltages) based on the core voltage $V_{CC}$ and the I/O voltage $V_{CCIO}$. In some cases, each hysteresis control circuit may include a comparator that compares the core voltage $V_{CC}$ to the I/O voltage $V_{CCIO}$ and generates a hysteresis control signal. The hysteresis generators may generate a hysteresis voltage to be applied to an input buffer of an I/O cell based on the hysteresis control signals. For example, when a hysteresis control signal is at either a logic high or a logic low, a hysteresis generator may generate a first hysteresis voltage (e.g., 20 mV) if the hysteresis control signal is at a logic low and generate a second hysteresis voltage (e.g., 200 mV) if the hysteresis control signal is at a logic high. In some cases, the hysteresis voltage generated by the hysteresis generator may be based on the I/O voltage $V_{CCIO}$ utilized by the I/O cell. For example, the hysteresis voltage may scale with the I/O voltage $V_{CCIO}$, such that the hysteresis voltage is higher at higher I/O voltages. The hysteresis voltage may be directly proportional to the I/O voltage $V_{CCIO}$ in some cases. In this example, the hysteresis voltage may be around 150 mV if $V_{CCIO}$=1.8 V and around 200 mV if $V_{CCIO}$=3.3 V.

In some aspects, the I/O fabric of the PLD may be partitioned into I/O banks (e.g., also referred to as I/O groups). Each I/O bank includes multiple I/O cells, with each I/O cell of a given I/O bank being operated (e.g., powered) using the same $V_{CCIO}$ level. In these aspects, a hysteresis control circuit may generate a hysteresis control signal to control hysteresis on a per-bank basis. In this regard, for a given I/O bank, the hysteresis control signal may control hysteresis applied to the input buffers of the I/O cells (e.g., all the I/O cells) of the I/O bank.

The hysteresis control circuits and hysteresis generators may adapt in response to changes in the I/O voltage $V_{CCIO}$ utilized to operate the I/O cells. In this regard, the hysteresis control circuits and hysteresis generators may generate the hysteresis control signals and hysteresis voltages, respectively, based on the $V_{CCIO}$ voltage level utilized at a given moment in time (e.g., during configuration mode or functional mode). For example, an I/O bank may operate using a first I/O voltage (e.g., 1.8 V) during configuration of the PLD (e.g., the I/Os may be utilized to read in configuration data) in a configuration mode (e.g., also referred to as a programming mode). After configuration of the PLD, the PLD transitions from the configuration mode to a functional mode (e.g., also referred to as an operational mode, a normal mode, or a post-configuration mode). In the functional mode, the I/O bank may be configured (e.g., programmed) to operate using a second I/O voltage (e.g., 1.2 V). Such adaptivity of the hysteresis control circuits and hysteresis generators to changes in the $V_{CCIO}$ levels may allow die size reduction relative to a case in which separate hysteresis control circuitry and/or separate hysteresis generating circuitry are provided for each I/O cell for the configuration mode and functional mode and/or for each possible $V_{CCIO}$ level.

In some embodiments, the hysteresis generator may implement a multistage hysteresis circuit. For example, the hysteresis generator may include a first hysteresis circuit and a second hysteresis circuit. During operation of an I/O cell using the I/O voltage $V_{CCIO}$, the first hysteresis circuit may be turned on to provide a first hysteresis voltage. The second hysteresis circuit may be selectively turned on (e.g., activated) or turned off (e.g., deactivated, not activated) based on a comparison of the I/O voltage $V_{CCIO}$ and the core voltage $V_{CC}$. When turned on, the second hysteresis circuit may provide a second hysteresis voltage.

In some aspects, techniques described herein may be utilized with complementary metal-oxide-semiconductor (CMOS) technologies, such as low voltage CMOS (LVCMOS) technologies. When implemented using LVCMOS technologies, by way of non-limiting example, the logic fabric may be operated using a core power supply $V_{CC}$ of 1.2 V and the I/O fabric (e.g., the I/O cells) may be operated (e.g., powered) using a power supply selected from a $V_{CCIO}$ voltage level of 1.2 V, 1.8 V, 2.5 V, 3.3 V, and/or other $V_{CCIO}$ voltage levels accommodated by LVCMOS technologies. In other aspects, the I/O cells may be implemented using other technologies, which may be associated with different $V_{CC}$ and/or $V_{CCIO}$ voltage levels than the example voltages previously provided.

Referring now to the figures, FIG. 1 illustrates a block diagram of a PLD 100 in accordance with an embodiment of the disclosure. The PLD 100 (e.g., an FPGA, a CPLD, an FPSC, or other type of programmable device) generally includes I/O blocks 102 and programmable logic blocks (PLBs) 104. In some cases, the PLD 100 may generally be any type of programmable device (e.g., programmable integrated circuit) with distributed configuration, which may involve loading configuration data through pins, shifting to appropriate locations in associated fabric, and configuring configuration memory cells. The PLBs may also be referred to as logic blocks, programmable functional units (PFUs), or programmable logic cells (PLCs). In an aspect, the PLBs 104 may collectively form an integrated circuit (IC) core or logic core of the PLD 100. The I/O blocks 102 provide I/O functionality (e.g., to support one or more I/O and/or memory interface standards) for the PLD 100, while the PLBs 104 provide logic functionality (e.g., LUT-based logic) for the PLD 100. Additional I/O functionality may be provided by serializer/deserializer (SERDES) blocks 150 and physical coding sublayer (PCS) blocks 152. The PLD 100 may also include hard intellectual property core (IP) blocks 160 to provide additional functionality (e.g., substantially predetermined functionality provided in hardware which may be configured with less programming than the PLBs 104).

The PLD 100 may include blocks of memory 106 (e.g., blocks of erasable programmable read-only memory (EEPROM), block static RAM (SRAM), and/or flash memory), clock-related circuitry 108 (e.g., clock sources, phase-locked loop (PLL) circuits, and/or delay-locked loop (DLL) circuits), and/or various routing resources 180 (e.g., interconnect and appropriate switching circuits to provide paths for routing signals throughout the PLD 100, such as for clock signals, data signals, control signals, wakeup signals, or others) as appropriate. The PLD 100 may include configuration and activation logic to receive configuration data, configure various programmable elements of the PLD 100, and activate functionality associated with these programmable elements. In general, the various elements of the PLD 100 may be used to perform their intended functions for desired applications, as would be understood by one skilled in the art.

For example, certain of the I/O blocks 102 may be used for programming the memory 106 or transferring information (e.g., various types of user data and/or control signals) to/from the PLD 100. Other of the I/O blocks 102 include a first programming port (which may represent a central processing unit (CPU) port, a peripheral data port, a serial peripheral interface (SPI) interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, the I/O blocks 102 may be included to receive configuration data and commands (e.g., over one or more connections) to configure the PLD 100 for its intended use and to support serial or parallel device configuration and information transfer with the SERDES blocks 150, PCS blocks 152, hard IP blocks 160, and/or PLBs 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout the PLD 100, such as in and between the PLBs 104, hard IP blocks 160, and routing resources 180 to perform their conventional functions (e.g., storing configuration data that configures the PLD 100 or providing interconnect structure within the PLD 100). For example, the routing resources 180 may be used for internal connections within each PLB 104 and/or between different PLBs 104. It should also be understood that the various embodiments disclosed herein are not limited to programmable logic devices, such as the PLD 100, and may be applied to various other types of programmable devices, as would be understood by one skilled in the art.

An external system 130 may be used to create a desired user configuration or design of the PLD 100 and generate corresponding configuration data to program (e.g., configure) the PLD 100. For example, to configure the PLD 100, the system 130 may provide such configuration data to one or more of the I/O blocks 102, PLBs 104, SERDES blocks 150, and/or other portions of the PLD 100. In this regard, the external system 130 may include a link 140 that connects to a programming port (e.g., SPI, JTAG) of the PLD 100 to facilitate transfer of the configuration data from the external system 130 to the PLD 100. As a result, the I/O blocks 102, PLBs 104, various of the routing resources 180, and any other appropriate components of the PLD 100 may be configured to operate in accordance with user-specified applications.

In the illustrated embodiment, the system 130 is implemented as a computer system. In this regard, the system 130 includes, for example, one or more processors 132 that may be configured to execute instructions, such as software instructions, provided in one or more memories 134 and/or stored in non-transitory form in one or more non-transitory machine readable media 136 (e.g., which may be internal or external to the system 130). For example, in some embodiments, the system 130 may run PLD configuration software, such as Lattice Diamond System Planner software available from Lattice Semiconductor Corporation to permit a user to create a desired configuration and generate corresponding configuration data to program the PLD 100.

In some embodiments, the memory 106 of the PLD 100 may include non-volatile memory (e.g., flash memory) utilized to store the configuration data generated and provided to the memory 106 by the external system 130. During configuration of the PLD 100, the non-volatile memory may provide the configuration data via configuration paths and associated data lines to configure the various portions (e.g., I/O blocks 102, PLBs 104, SERDES blocks 150, routing resources 180, and/or other portions) of the PLD 100. In some cases, the configuration data may be stored in non-volatile memory external to the PLD 100 (e.g., on an external hard drive such as the memories 134 in the system 130). During configuration, the configuration data may be provided (e.g., loaded) from the external non-volatile memory into the PLD 100 to configure the PLD 100.

The system 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of the PLD 100.

Figure 2:
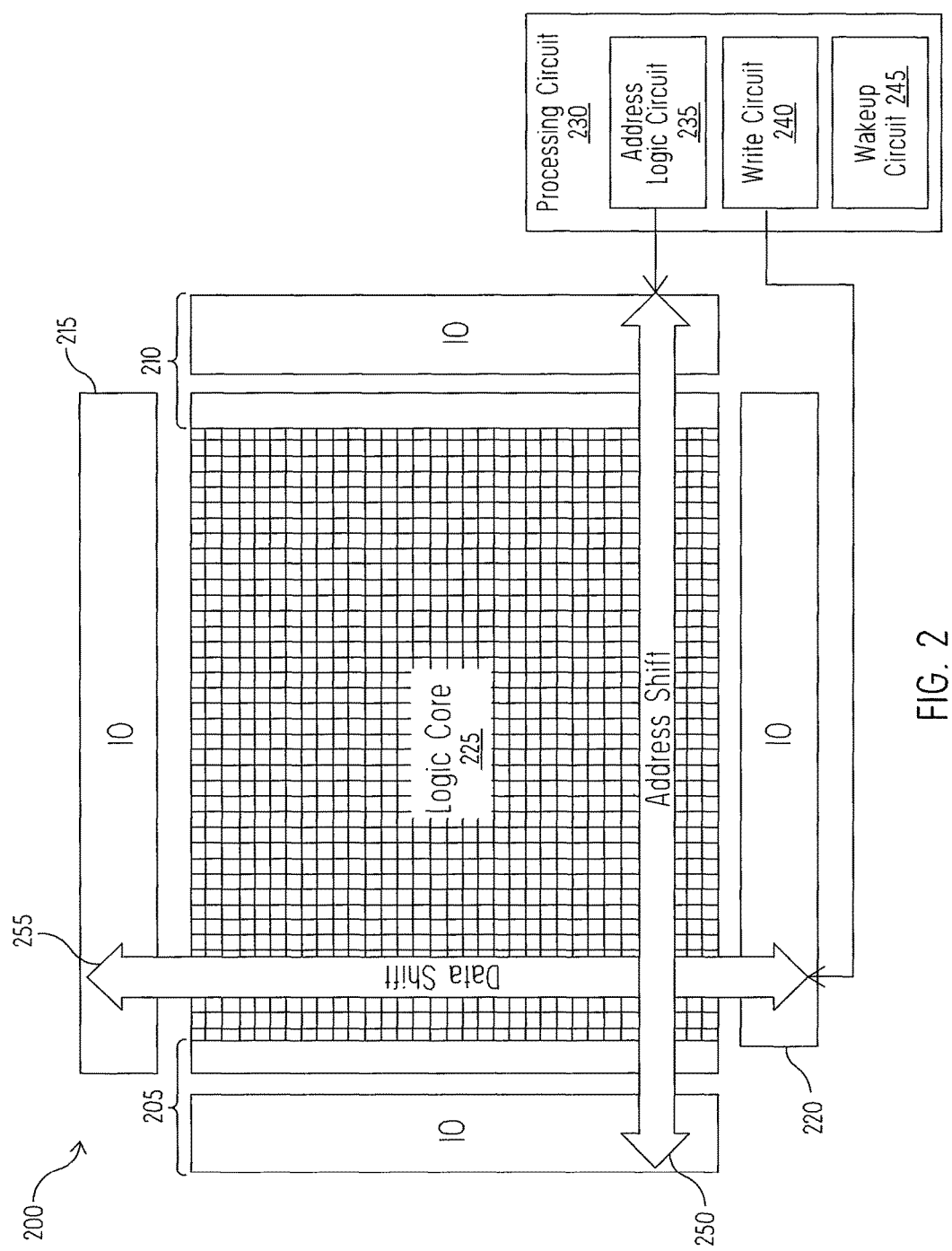
FIG. 2 illustrates a block diagram of a PLD with input/output fabric and logic fabric and an associated processing circuit in accordance with an embodiment of the disclosure.

FIG. 2 illustrates a block diagram of a PLD 200 with I/O fabric and logic fabric and an associated processing circuit 230 in accordance with an embodiment of the disclosure. The I/O fabric of the PLD 200 may be provided by I/O portions 205, 210, 215, and 220. The logic fabric of the PLD 200 may be provided by a logic core 225 (e.g., also referred to as an IC core). The I/O portions 205, 210, 215, and/or 220 may include logic, resources (e.g., routing resources), configuration memory usable for storing configuration data, and/or generally any components, that are associated with facilitating providing of the I/O fabric's functionality. Similarly, the logic core 225 may include logic, resources (e.g., routing resources), configuration memory usable for storing configuration data, and/or generally any components, that are associated with facilitating providing of the logic fabric's functionality.

In an embodiment, the PLD 200 may be, may include, or may be a part of the PLD 100. In an aspect, the I/O fabric of the PLD 200 may include the I/O blocks 102, SERDES blocks 150, PCS blocks 152, and associated circuitry (e.g., routing resources 180, clock-related circuitry 108, and/or connections thereto, etc.). In an aspect, the logic fabric may include the PLBs 104, hard IP blocks 160, and associated circuitry.

The configuration memory of the PLD 200 may include an array of configuration memory cells usable to store configuration data (e.g., each configuration memory cell may store one bit). The array of configuration memory cells may be arranged in rows and columns. In an aspect, the I/O portions 205, 210, 215, and/or 220 and the logic core 225 may include configuration memory cells (e.g., arranged in rows and columns) and form a portion of the array. The configuration memory cells may be volatile memory cells (e.g., RAM cells, such as SRAM cells). In some cases, the configuration memory cells may be referred to as configuration RAM (CRAM) cells. Although the present disclosure generally refers to various operations performed on rows and/or columns, rows may be used as columns and columns may be used as rows as appropriate. In an aspect, configuration memory cells associated with I/O and logic may be referred to as I/O block configuration memory cells and logic block configuration memory cells.

To configure (e.g., program) the PLD 200 (e.g., the I/O fabric and the logic fabric), the configuration data can be provided as a configuration bitstream that is loaded serially or in parallel into the configuration memory cells. In some cases, shifting may be performed serially, such as using JTAG or SPI×1 mode. Alternatively or in addition, in some cases, shifting may be in parallel, then followed by internally shifting parallel/serial, such as using SPI×4 mode or parallel ×8 mode for example. The processing circuit 230 of the PLD 200 may include an address logic circuit 235 to assert an address (e.g., column address) of the PLD 200 and a data write circuit 240 to load corresponding configuration data into one or more configuration memory cells associated with the asserted address. For example, the address logic circuit 235 may be utilized to selectively assert columns of the array using respective address lines (not shown) to allow configuration data to be loaded into the configuration memory cells using the data write circuit 240.

In FIG. 2, the address logic circuit 235 may be, or may be utilized to control (e.g., using control signals), an address shifter to effectuate a column-by-column address shift (e.g., represented by address shift 250) across columns of the PLD 200. The data write circuit 240 may be, or may be utilized to control (e.g., using control signals), a data shifter to receive a portion of the configuration data corresponding to an asserted column and load the portion of the configuration data into corresponding configuration memory cells (e.g., represented by data shift 255) of the PLD 200. In this regard, the configuration data may be loaded into the PLD 200 one column at a time by pushing data to be written into a data shifter controlled by the data write circuit 240, asserting a column address using the address logic circuit 235 to allow data to be written into configuration memory cells associated with the asserted column address, and loading the data into these configuration memory cells. Such pushing of configuration data, asserting of column address, and loading of configuration data may be performed for each subsequent column of the PLD 200 until the columns of the configuration memory have been loaded with their corresponding configuration data.

The processing circuit 230 of the PLD 200 may include a wakeup circuit 245 to wake up (e.g., activate) functionality of the I/O fabric and logic fabric after the configuration data have been loaded into the configuration memory cells associated with (e.g., utilized to implement) the I/O fabric and logic fabric. In an aspect, wakeup may refer to transitioning the PLD 200 from a configuration mode, in which configuration data is being loaded into the PLD 200, to a functional mode (e.g., also referred to as an operational mode, a normal mode, or a post-configuration mode), in which the PLD 200 provides I/O and logic functionality. In this regard, after wakeup of the PLD 200 is complete, the PLD 200 is configured to operate using its I/O and logic fabric to provide I/O and logic functionality in accordance with user-specified applications. Such I/O and logic functionality may be effectuated through use of associated logic, resources (e.g., routing resources), stored configuration data, and/or other associated components. In some cases, a portion of the I/O fabric may provide static state control whereas another portion of the I/O fabric may be driven by (e.g., controlled by) the logic fabric.

In an embodiment, the processing circuit 230 may be, may include, or may be part of configuration and activation logic circuitry to receive configuration data, configure configuration memory cells of the PLD 200, and activate functionality of the I/O fabric and/or logic fabric associated with the configuration memory cells. In some cases, at least a portion of such circuitry is hardcoded in the PLD 200. For example, the address logic circuit 235, data write circuit 240, and wakeup circuit 245 may be hardcoded in the PLD 200.

In one or more embodiments, the I/O portions 205, 210, 215, and 220 that provide the I/O fabric of the PLD 200 may form one or more I/O banks or portions thereof. Each I/O bank may include multiple I/O cells. Each I/O cell is part of one of the I/O banks that form the I/O fabric of the PLD 200 (e.g., no I/O cell is part of more than one I/O bank). In one example, each of the I/O portions 205, 210, 215, and 220 may be one I/O bank. In another example, the I/O portion 205 may be formed of two or more I/O banks, with each I/O bank including a respective plurality of I/O cells. Various manners by which to define I/O banks from the I/O portions 205, 210, 215, and 220 may be implemented. In an aspect, each I/O cell of an I/O bank is powered by the same $V_{CCIO}$ voltage level. Different I/O banks may be powered by different $V_{CCIO}$ voltage levels. For example, when the I/O portion 205 is formed of three I/O banks, a first I/O bank may be powered by a $V_{CCIO}$ voltage of 1.2 V, a second I/O bank may be powered by a $V_{CCIO}$ voltage of 2.5 V, and a third I/O bank may be powered by a $V_{CCIO}$ voltage of 1.2 V.

Hysteresis voltages may be applied to an input buffer of each I/O cell of the I/O portions 205, 210, 215, and 220. In some aspects, a hysteresis voltage may be applied on a per-I/O bank basis (e.g., also referred to as a per-I/O group basis, per-group basis, or per-bank basis), such that a respective hysteresis voltage is determined on a per-bank basis and applied to I/O cells of a respective I/O bank. As one example, when the I/O portions 205, 210, 215, and 220 each form one I/O bank, a first hysteresis voltage may be determined for the I/O portion 205 and applied to the I/O portion 205, a second hysteresis voltage may be determined for the I/O portion 210 and applied to the I/O portion 210, and so on. For a given I/O bank, the hysteresis voltage applied to I/O cells of the I/O bank may be determined based at least on the $V_{CCIO}$ voltage for the I/O bank.

In some embodiments, the hysteresis voltage may move trip points of the input buffers of the I/O cells. In some cases, for a given I/O cell, the $V_{CCIO}$ voltage for the I/O cell may determine a difference between a trip point when the input buffer of the I/O cell transitions from low to high and the trip point when the input buffer transitions from high to low. In an example, without hysteresis, the low-to-high and high-to-low trip points, denoted as $V_{L2H}$ and $V_{H2L}$ respectively, may both be set at a voltage level midway between VCCIO and ground (e.g., 1.65 V when $V_{CCIO}$ is 3.3 V). With hysteresis applied, the trip point for low-to-high transitions may be $V_{L2H} > V_{CCIO}/2$ and the trip point for high-to-low transitions may be $V_{H2L} < V_{CCIO}/2$. As such, the hysteresis causes a non-zero difference between the trip points. In one example, when VCCIO=3.3 V, the hysteresis applied to the input buffer may be 200 mV, such that $V_{L2H}$=1.75 V and $V_{H2L}$=1.55 V for the input buffer.

In some aspects, the hysteresis applied to the input buffers of the I/O cells to move trip points associated with the input buffers may mitigate system noise and/or fluctuations in the $V_{CCIO}$ and/or $V_{CC}$ levels. For example, without applying a hysteresis voltage, the output of the input buffer may be more susceptible to transitioning from low-to-high or high-to-low in response to the system noise and/or fluctuations in the $V_{CCIO}$ and/or $V_{CC}$ levels. In an embodiment, hysteresis may be applied for technologies associated with lower voltages, such as LVCMOS technologies. In some cases, the LVCMOS technology may utilize a core voltage $V_{CC}$ of 1.2 V and an I/O voltage $V_{CCIO}$ selected from 1.2 V, 1.8 V, 2.5 V, or 3.3 V (e.g., also referred to as LVCMOS12, LVCMOS18, LVCMOS25, and LVCMOS33, respectively).

In some embodiments, the $V_{CCIO}$ voltage for a given I/O bank in the configuration mode (e.g., during configuration of the PLD 100) may be the same or different from the $V_{CCIO}$ voltage for the I/O bank in the functional mode (e.g., after configuration of the PLD 100). In this regard, configuration bits may define a $V_{CCIO}$ voltage to be utilized for an I/O bank after configuration of the PLD. As such, based on the $V_{CCIO}$ voltage utilized before and after configuration of the PLD, the hysteresis voltage for the I/O bank in the configuration mode may be the same or different from the hysteresis voltage for the I/O bank in the functional mode. For example, if the I/O bank is operated using a VCCIO voltage of 1.8 V in the configuration mode and functional mode, the hysteresis voltage for the I/O bank may remain around the same in the configuration mode and functional mode. If the VCCIO voltage is 1.2 V and 1.8 V for the I/O bank in the configuration mode and functional mode, respectively, the hysteresis voltages for the I/O bank in configuration mode and functional mode may be different.

Using various embodiments, determining and applying of a hysteresis voltage on a per-bank basis may allow die size reduction, such as relative to a case in which separate hysteresis circuitry is provided for the configuration mode and the functional mode for each I/O cell. Die size reduction may be achieved since, for each I/O cell, one hysteresis circuitry may be utilized for both the configuration mode and the functional mode. The hysteresis voltage may adaptively adjust in response to changes in the $V_{CCIO}$ used to operate the I/O bank, such as when the $V_{CCIO}$ voltage used for the configuration mode is different from the $V_{CCIO}$ voltage used for the functional mode for a given I/O bank.

Figure 3:
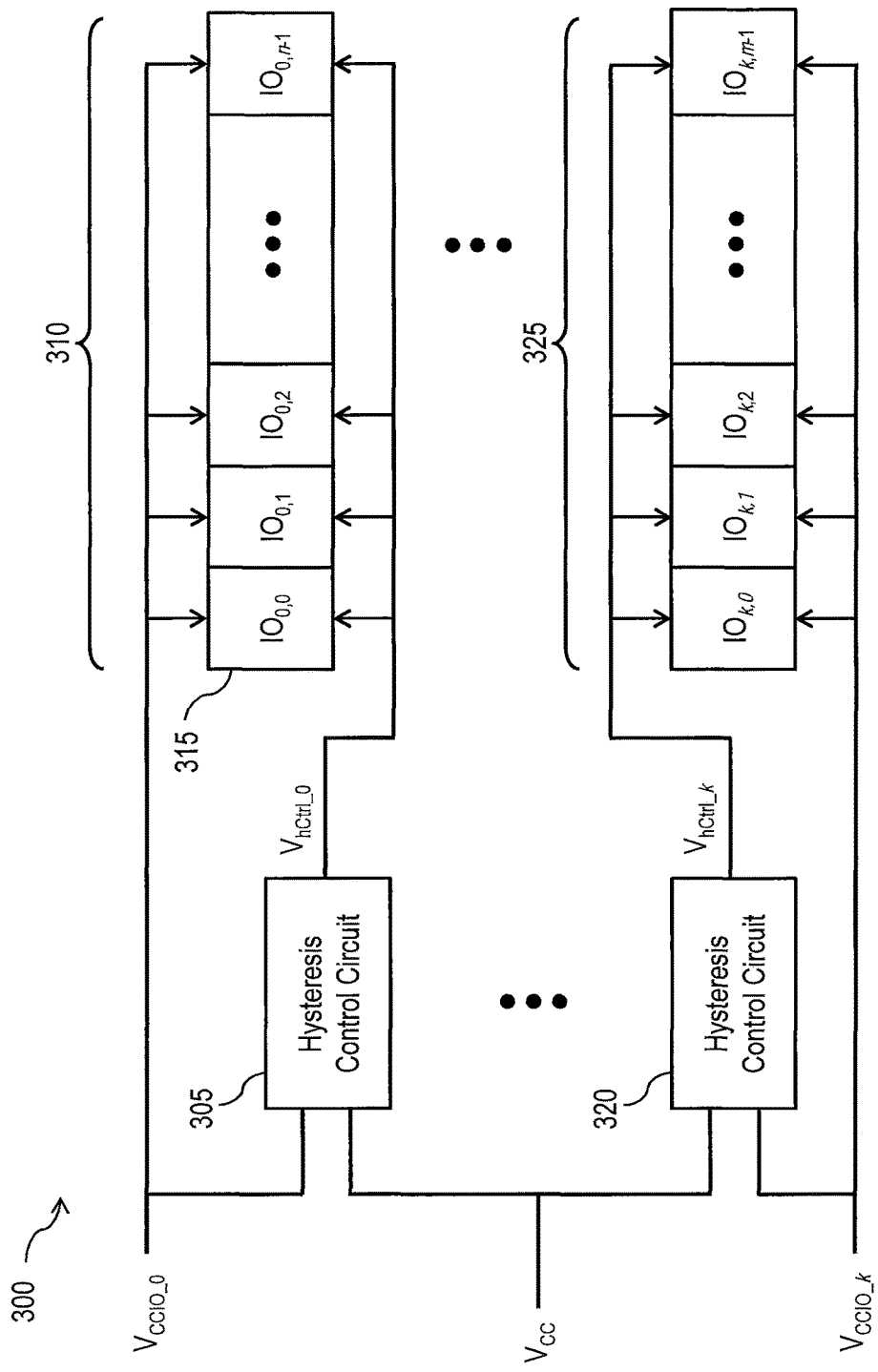
FIG. 3 illustrates a block diagram of a system for facilitating hysteresis control for a PLD in accordance with an embodiment of the disclosure.

FIG. 3 illustrates a block diagram of a system 300 for facilitating hysteresis control for a PLD in accordance with an embodiment of the disclosure. In an embodiment, the hysteresis control may be applied to I/O cells that form an I/O fabric of a PLD (e.g., the PLD 100 or 200). Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The system 300 includes a hysteresis control circuit 305, an I/O bank 310 associated with the hysteresis control circuit 305, a hysteresis control circuit 320, and an I/O bank 325 associated with the hysteresis control circuit 320. The I/O bank 310 includes an I/O cell 315 (e.g., also identified as $IO_{0,0}$) and I/O cells identified as $IO_{0,1}$, $IO_{0,2}$, and $IO_{0,n-1}$, where the I/O bank 310 has n I/O cells. The I/O bank 325 includes I/O cells identified as $IO_{k,0}$, $IO_{k,1}$, $IO_{k,2}$, and $IO_{k,m-1}$, where the I/O bank 310 has m I/O cells. In one case, n may be, but need not be, different from m. The I/O bank 310 and I/O bank 325 may be referred to as a zeroth I/O bank and a $k^{th}$ I/O bank, respectively.

The hysteresis control circuit 305 generates a hysteresis control voltage $V_{hCtrl\_0}$ for the I/O bank 310. In an aspect, the hysteresis control circuit 305 may generate the hysteresis control voltage $V_{hCtrl\_0}$ based on the core voltage $V_{CC}$ and the I/O voltage $V_{CCIO\_0}$ that powers the I/O cells (e.g., including the I/O cell 315) of the I/O bank 310. In some cases, the hysteresis control voltage $V_{hCtrl\_0}$ may be utilized to selectively operate a hysteresis generator (not shown) in the I/O cells of the I/O bank 310. As an example, the hysteresis generator of the I/O cell 315 may generate a hysteresis voltage based on the hysteresis control voltage $V_{hCtrl\_0}$ and apply the hysteresis voltage to an input buffer of the I/O cell 315.

In an aspect, the hysteresis control voltage $V_{hCtrl\_0}$ may be utilized as a binary signal. In this aspect, when the hysteresis control voltage $V_{hCtrl\_0}$ is a logic low, the hysteresis generator may generate a lower hysteresis voltage. When the hysteresis control voltage $V_{hCtrl\_0}$ is a logic high, the hysteresis generator may generate a higher hysteresis voltage. For example, the lower hysteresis voltage may be around 25 mV and the higher hysteresis voltage may be around 150 mV. In some cases, the hysteresis generator of an I/O cell may generate the hysteresis voltage based on the I/O voltage $V_{CCIO}$ used to operate the I/O cell. In some cases, the hysteresis voltage may scale with the I/O voltage $V_{CCIO}$.

It is noted that the ellipses between components of FIG. 3 may represent one or more additional components or no additional components. In this regard, the ellipses between $IO_{0,2}$ and $IO_{0,n-1}$ indicate that one or more additional I/O cells or no I/O cell are present between $IO_{0,2}$ and $IO_{0,n-1}$ and the ellipses between $IO_{k,2}$ and $IO_{k,m-1}$ indicate that one or more additional I/O cells or no I/O cell are present between $IO_{k,2}$ and $IO_{k,m-1}$. The ellipses between the I/O bank 310 and the I/O bank 325 may represent one or more additional I/O banks or no I/O bank are between the IO bank 310 and the IO bank 325. Similarly, the ellipses between the hysteresis control circuit 305 and the hysteresis control circuit 320 may represent one or more additional hysteresis control circuits or no hysteresis control circuit are between the hysteresis control circuit 305 and the hysteresis control circuit 320.

The foregoing description for the hysteresis control circuit 305 and the I/O bank 310 generally applies to the hysteresis control circuit 320 and the I/O bank 325. In this regard, the hysteresis control circuit 320 may generate a hysteresis control voltage $V_{hCtrl\_k}$ for the I/O bank 325 based on the core voltage $V_{CC}$ and the I/O voltage $V_{CCIO\_k}$ for the I/O bank 325. Although the foregoing describes an output of a hysteresis control circuit (e.g., 305, 320) as a hysteresis control voltage, the output of the hysteresis control circuit 305 may more generally be referred to as a hysteresis control signal and may be a current signal, an optical signal, or generally any signal that can indicate a state of the hysteresis control signal to facilitate hysteresis control.

Figure 4:
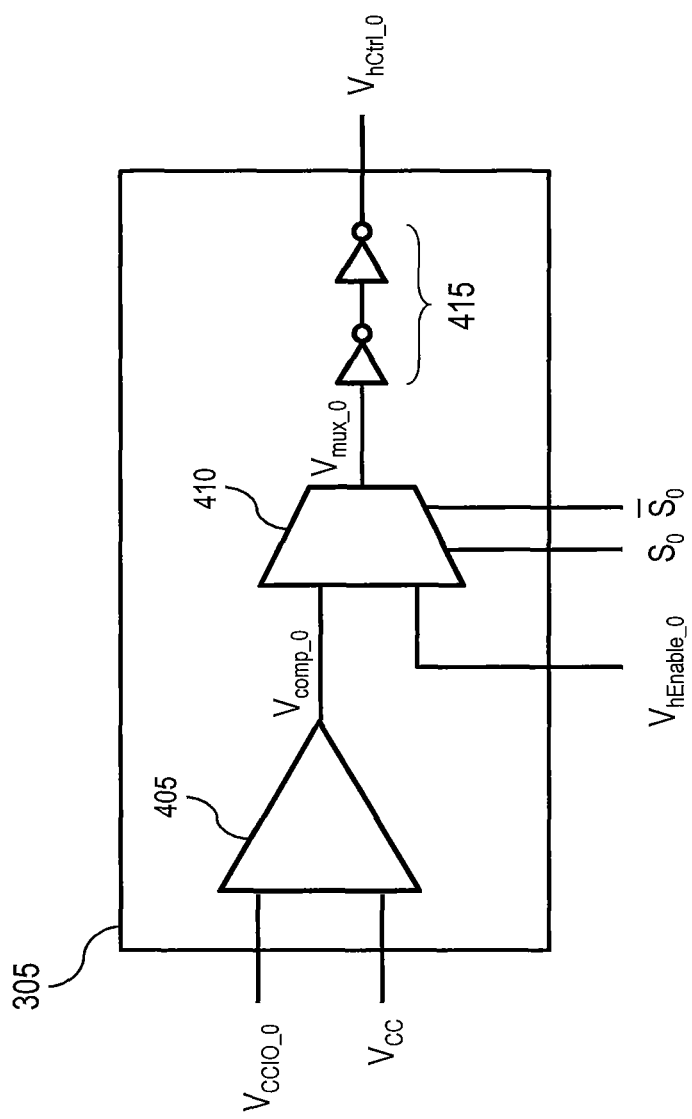
FIG. 4 illustrates an example implementation of a hysteresis control circuit in accordance with an embodiment of the disclosure.

FIG. 4 illustrates an example implementation of the hysteresis control circuit 305 of FIG. 3 in accordance with an embodiment of the disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. For example, the hysteresis control circuit 305 may include protection circuitry not shown in FIG. 4.

As described with reference to FIG. 3, the hysteresis control circuit 305 may generate the hysteresis control voltage $V_{hCtrl\_0}$ for the I/O cells of the I/O bank 310. The hysteresis control voltage $V_{hCtrl\_0}$ may be generated based on the core voltage $V_{CC}$ and the I/O voltage $V_{CCIO\_0}$ used for the I/O cells of the I/O bank 310. In an embodiment, the hysteresis control circuit 320 of FIG. 3 or other hysteresis control circuit not shown in FIG. 3 may be implemented in the same or similar manner as the hysteresis control circuit 305.

The hysteresis control circuit 305 includes a comparator 405, a multiplexer 410, and a buffer 415. The comparator 405 receives the core voltage $V_{CC}$ at a first input terminal and the I/O voltage $V_{CCIO\_0}$ at a second input terminal. The comparator 405 may generate a comparator output voltage $V_{comp\_0}$ at an output terminal of the comparator 405 by comparing the core voltage $V_{CC}$ to the I/O voltage $V_{CCIO\_0}$. In one case, the comparator output voltage $V_{comp\_0}$ may be at logic high (e.g., 1) when the comparator 405 determines that $V_{CCIO\_0} > V_{CC}$. The comparator output voltage $V_{comp\_0}$ may be at logic low (e.g., 0) when the comparator 405 determines that $V_{CCIO\_0} \leq V_{CC}$. For example, in the case that $V_{CC} = 1.2$ V and $V_{CCIO\_0}$ is one of 1.2 V, 1.8 V, 2.5 V, and 3.3 V, $V_{comp\_0}$ may be at logic high when $V_{comp\_0}$ is 1.8 V, 2.5 V, or 3.3 V and logic low when $V_{CCIO\_0}$ is 1.2 V.

The multiplexer 410 selects one of the comparator output voltage $V_{comp\_0}$ or a hysteresis enable voltage $V_{hEnable\_0}$ as its multiplexer output voltage $V_{mux\_0}$. The multiplexer 410 may perform the selection based on a selection signal $S_0$. In FIG. 3, a selection signal $\overline{S}_0$ complementary to the selection signal $S_0$ may also be provided to the multiplexer 410. In one case, the selection signal $S_0$ may be a single bit. For example, the selection signal $S_0$ may have a value of 0 to cause the multiplexer 410 to select the comparator output voltage $V_{comp\_0}$ as the multiplexer output voltage $V_{mux\_0}$. The selection signal $S_0$ may have a value of 1 to cause the multiplexer 410 to select the hysteresis enable voltage $V_{hEnable\_0}$ as the multiplexer output voltage $V_{mux\_0}$. The buffer 415 may buffer the multiplexer output voltage $V_{mux\_0}$ and provide the hysteresis control signal $V_{hCtrl\_0}$ based on the multiplexer output voltage $V_{mux\_0}$. The hysteresis control signal $V_{hCtrl\_0}$ may be provided (e.g., routed) to the I/O cells (e.g., 315) of the I/O bank 310. Although the buffer 415 is depicted as two inverters, the buffer 415 may generally be implemented using any appropriate buffer circuitry for providing the hysteresis control signal $V_{hCtrl\_0}$ based on the multiplexer output voltage $V_{mux\_0}$.

In some embodiments, by providing the multiplexer 410 and utilizing the hysteresis enable voltage $V_{hEnable\_0}$, a PLD that includes the I/O bank 310 may allow a user of the PLD to apply a hysteresis to the I/O bank 310 based on a state (e.g., logic high, logic low) of the hysteresis enable voltage $V_{hEnable\_0}$ rather than the comparator output voltage $V_{comp\_0}$. For example, when the hysteresis enable voltage $V_{hEnable\_0}$ is selected and has a logic low, the hysteresis control voltage $V_{hCtrl\_0}$ has a logic low and the hysteresis generator may generate a lower hysteresis voltage. When the hysteresis enable voltage $V_{hEnable\_0}$ is selected and has a logic high, the hysteresis control voltage $V_{hctrl\_0}$ has a logic high and the hysteresis generator may generate a higher hysteresis voltage. As such, in some cases, the multiplexer 410 and the hysteresis enable voltage $V_{hEnable\_0}$ may provide the user with flexibility to cause the lower hysteresis voltage or the higher hysteresis voltage to be generated and applied regardless of a difference (or lack thereof) between the core voltage $V_{CC}$ and the I/O voltage $V_{CCIO\_0}$. In some cases, the multiplexer 410 and the hysteresis enable voltage $V_{hEnable\_0}$ may be utilized for the functional mode. For example, in some cases, the multiplexer 410, hysteresis enable voltage $V_{hEnable\_0}$, and/or selection signal $S_0$ are not defined prior to configuring the PLD. In this example, the multiplexer 410, hysteresis enable voltage $V_{hEnable\_0}$, and/or selection signal $S_0$ may be programmed by configuration bits.

In some aspects, the multiplexer 410 is optional. For example, the multiplexer 410 and associated signals (e.g., $V_{hEnable\_0}$, $S_0$, $\overline{S_0}$) may be omitted, such that the comparator output voltage $V_{comp\_0}$ is buffered by the buffer 415 and provided as the hysteresis control voltage $V_{hCtrl\_0}$.

Figure 5:
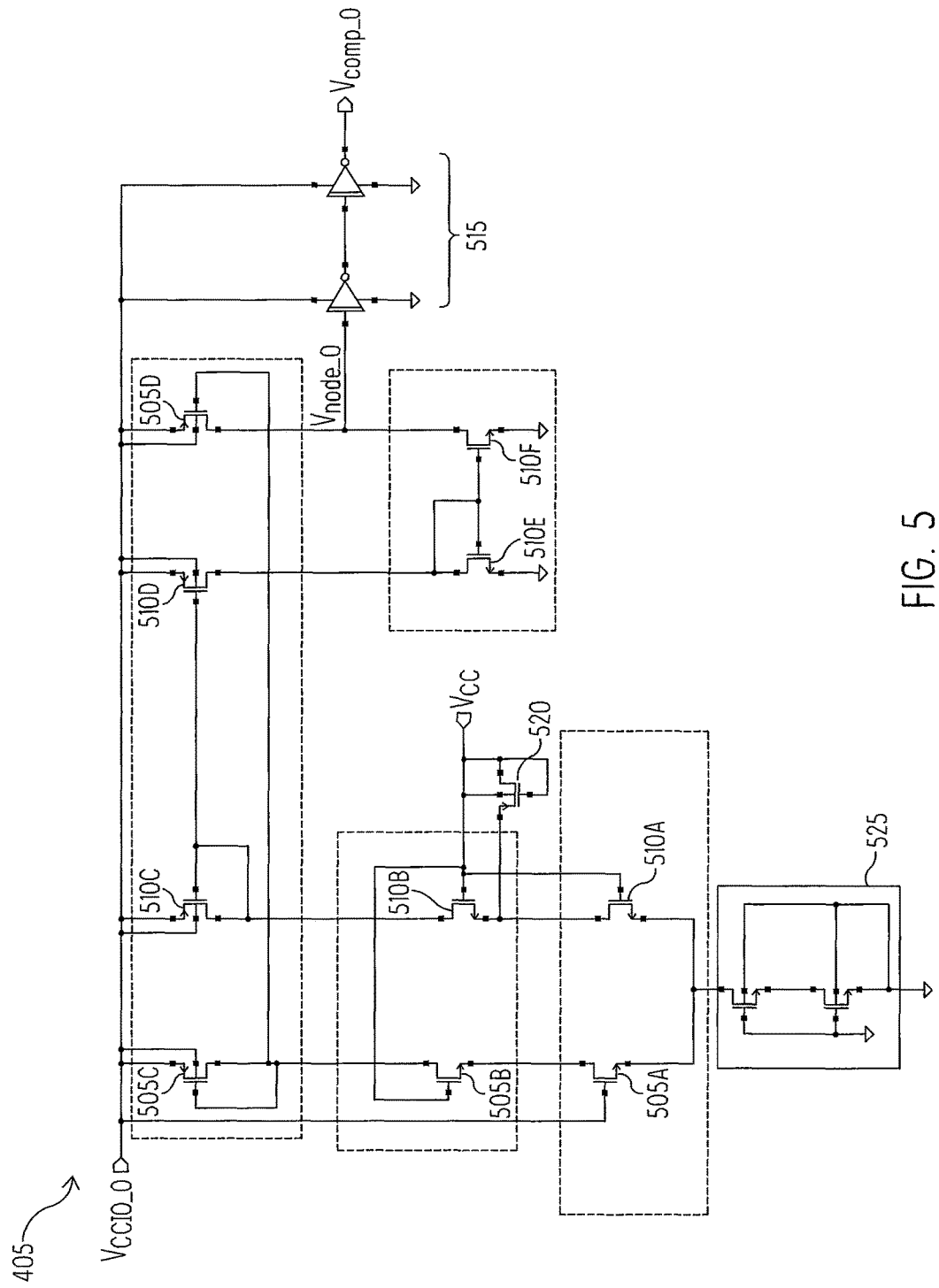
FIG. 5 illustrates an example implementation of a comparator in accordance with an embodiment of the disclosure.

FIG. 5 illustrates an example implementation of the comparator 405 of FIG. 4 in accordance with an embodiment of the disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. For example, the comparator 405 may include protection circuitry and/or dummy circuitry (e.g., dummy transistors to improve symmetry and/or facilitate fabrication) not shown in FIG. 4.

The comparator 405 includes transistors 505A-D, transistors 510A-F, a buffer 515, a transistor 520, and a current source 525. In an embodiment, in FIG. 5, the transistors 505A, 505B, 510A, 510B, 510E, and 510F are n-type MOS (NMOS) devices, and the transistors 505C, 505D, 510C, and 510D are p-type MOS (PMOS) devices. The core voltage $V_{CC}$ is applied to the transistors 505B, 510A, and 510B (e.g., a gate of these transistors). The I/O voltage $V_{CCIO\_0}$ is applied to the transistor 505A (e.g., a gate of the transistor 505A).

In an example configuration, as shown in FIG. 5, a source of the transistor 505A is connected to the current source 525 and a source of the transistor 510A. A drain of the transistor 505A is connected to a source of the transistor 505B. A gate of the transistor 505B is connected to a gate of the transistor 510B. A drain of the transistor 505B is connected to a drain of the transistor 505C. The drain of the transistors 505B and 505C is connected to a gate of the transistor 505D. A gate of the transistor 505C is connected to the gate of the transistor 505D. A source of the transistor 505C is connected to a source of the transistors 510C, 510D, and 505D. A gate of the transistor 510A is connected to a gate of the transistor 510B. A drain of the transistor 510A is connected to a source of the transistor 510B. A drain of the transistor 510B is connected to a drain of the transistor 510C. A gate of the transistor 510C is connected to a gate of the transistor 510D. A drain of the transistor 510D is connected to a drain and a gate of the transistor 510E. A gate of the transistor 510E is connected to a gate of the transistor 510F. A drain of the transistor 510F is connected to a drain of the transistor 505D. A node at the drain of the transistors 505D and 510F is identified by its node voltage $V_{node\_0}$. The transistors 505C, 510C, and 510E may be diode-connected transistors. The I/O voltage $V_{CCIO\_0}$ is provided at the gate of the transistor 505A and a source of the transistors 505C, 510C, 505D, and 510D. In this regard, the gate of the transistor 505A and the source of the transistors 505C, 510C, 505D, and 510D may be tied to a power rail that provides the I/O voltage $V_{CCIO\_0}$. A source of the transistors 510E and 510F are tied to ground.

It is noted that FIG. 5 illustrates one example configuration for implementing the comparator 405. In another embodiment, additional, fewer, and/or different combination/arrangement of NMOS and PMOS devices than those shown in FIG. 5 may be utilized to implement the comparator 405.

The transistors 505A-C form a left branch of the comparator 405, and the transistors 510A-C form a right branch of the comparator 405. In some embodiments, the comparator output voltage $V_{comp\_0}$ generated by the comparator 405 may be based on whether the left branch conducts or the right branch conducts. In an aspect, a branch (e.g., left branch, right branch) may be referred to as being activated when the branch conducts, and the branch may be referred to as being deactivated or not activated when the branch does not conduct.

In an embodiment, when $V_{CCIO\_0} > V_{CC}$, the comparator 405 may be configured such that the left branch conducts. In this regard, the transistors 505A-C are turned on (e.g., closed) and a current flows through the transistors 505A-C. The current that flows through the transistor 505C may be mirrored to a current mirror implemented by the transistor 505D. With the transistor 505D turned on, the I/O voltage $V_{CCIO\_0}$ couples to the node at a drain of the transistor 505D via the transistor 505D. As such, a node voltage $V_{node\_0}$ of the node is at a logic high. The buffer 515 may buffer the node voltage $V_{node\_0}$ and generate the comparator output voltage $V_{comp\_0}$ having a logic high based on the node voltage $V_{node\_0}$. In some cases, the node voltage $V_{node\_0}$ may be at a lower voltage level associated with a logic high whereas the buffer 515 may drive the node voltage $V_{node\_0}$ to a higher voltage level (e.g., rail voltage level) associated with a logic high. The higher voltage level output from the buffer 515 may be provided as the comparator output voltage $V_{comp\_0}$. Although the buffer 515 is depicted as two inverters, the buffer 515 may generally be implemented using any appropriate buffer circuitry for providing the comparator output voltage $V_{comp\_0}$ based on the node voltage $V_{node\_0}$. As such, the left branch may be referred to as conducting when a current flows through the transistors 505A-C and is mirrored to the transistor 505D. When the left branch conducts, the node voltage $V_{node\_0}$ and comparator output voltage $V_{comp\_0}$ are at logic high.

In this embodiment, when $V_{CCIO\_0} \leq V_{CC}$, the comparator 405 may be configured such that the right branch conducts. In this regard, the transistors 510A-C are turned on and a current flows through the transistors 510A-C. The current that flows through the transistor 510C may be mirrored to a current mirror implemented by the transistor 510D. With the transistor 510D turned on, the I/O voltage $V_{CCIO\_0}$ couples to the transistors 510E and 510F (e.g., a gate of these transistors) and turns on the transistors 510E and 510F. With the transistor 505D turned off (e.g., opened) and the transistors 510E and 510F turned on, the node at a drain of the transistor 510F is tied to ground via the transistor 510F. Thus, the node voltage $V_{node\_0}$ is at a logic low. The buffer 515 may buffer the node voltage $V_{node\_0}$ and generate the comparator output voltage $V_{comp\_0}$ at a logic low based on the node voltage $V_{node\_0}$. For example, the node voltage $V_{node\_0}$ may be at a higher voltage level associated with a logic low whereas the buffer 515 may drive the node voltage $V_{node\_0}$ to a lower voltage level associated with a logic low. The lower voltage level output from the buffer 515 may be provided as the comparator output voltage $V_{comp\_0}$. As such, the right branch may be referred to as conducting when a current flows through the transistors 510A-C, is mirrored to the transistor 510D, and flows through the transistors 510E and 510F. When the left branch conducts, the node voltage $V_{node\_0}$ and comparator output voltage $V_{comp\_0}$ are at logic low.

In some aspects, characteristics (e.g., transistor size, transistor material, gate oxide thickness) of one or more of the transistors 505A-D, transistors 510A-F, and/or transistor 520 may be utilized to configure the comparator 405 such that the comparator output voltage $V_{comp\_0}$ is at logic high when $V_{CCIO\_0} > V_{CC}$ and logic low when $V_{CCIO\_0} \le V_{CC}$. In an embodiment, the transistors 505A and 510A may form a mismatched differential pair with different gate oxide thicknesses. In some cases, the transistor 505A may be a thick oxide device and the transistor 510A may be a thin oxide device. For example, utilization of the thick oxide device and the thin oxide device for the transistors 505A and 510A, respectively, may allow the comparator 405 to set the comparator output voltage $V_{comp\_0}$ to a logic high in the case that $V_{CC}$ and $V_{CCIO\_0}$ are both around 1.2 V. In this example, when $V_{CC}$ and $V_{CCIO\_0}$ are both around 1.2 V, the transistor 510A exerts a stronger pull than the transistor 505A to cause a current to flow in the right branch (e.g., to cause the right branch to conduct).

In some aspects, the transistors 505B and 510B may be utilized as a protection circuit for the transistors 505A and 510A, respectively. The transistors 505B and 510B may be utilized to prevent overvoltage. Overvoltage may occur when a voltage in a circuit (e.g., a transistor) or a part of a circuit is raised to a voltage level higher than an operating voltage limit of one or more components of the circuit. In one or more implementations, the overvoltage may be based on an operating voltage limit of a transistor. Overvoltage may lead to breakdown of a transistor and cause reliability issues. In some cases, the transistor 510B may be utilized as a protection circuit for the transistor 510A to accommodate implementation of the transistor 510A as a thin oxide device, which is generally associated with a lower overvoltage, while the transistor 505B may be provided to maintain symmetry between the left and right branches.

In some cases, in addition to the transistor 510B, the transistor 520 may also provide a protection circuit for the transistor 510A. A drain of the transistor 520 is connected to a gate of the transistors 520, 510B, and 505B. A source of the transistor 520 is connected to the drain of the transistor 510A and the source of the transistor 510B. The core voltage $V_{CC}$ may be applied to a gate, drain, and body of the transistor 520. The transistor 520 may perform clamping to limit a voltage at the drain of the transistor 510A to prevent damage to the transistor 510A. As such, the transistor 520 may be referred to as a clamping circuit.

Utilization of the transistors 505B, 510B, and 520 as protection circuits may facilitate coexistence of different values of $V_{CC}$ and $V_{CCIO\_0}$. For example, when the I/O voltage $V_{CCIO\_0}$ is at a higher voltage level such as 3.3 V, the transistors 505B, 510B, and 520 may help prevent the I/O voltage $V_{CCIO\_0}$ from injecting current into the transistor 510A.

In some aspects, the transistors 505A and 510A are native transistors (e.g., transistors with nearly zero threshold voltage). The transistor 505A may be turned on in response to the I/O voltage $V_{CCIO\_0}$ applied on the transistor 505A (e.g., a gate of the transistor 505A) and the transistor 510A may be turned on in response to the core voltage $V_{CC}$ applied on the transistor 510A (e.g., a gate of the transistor 510A). In some cases, by using native transistors, the current source 525 may be implemented without using a band gap reference current source. A band gap reference current source may provide higher precision but use more die area (e.g., area for mirrored circuitry and routing resources). In other aspects, the current source 525 is implemented as a band gap reference current source and/or the transistors 505A and 510A are not native transistors.

Figure 6:
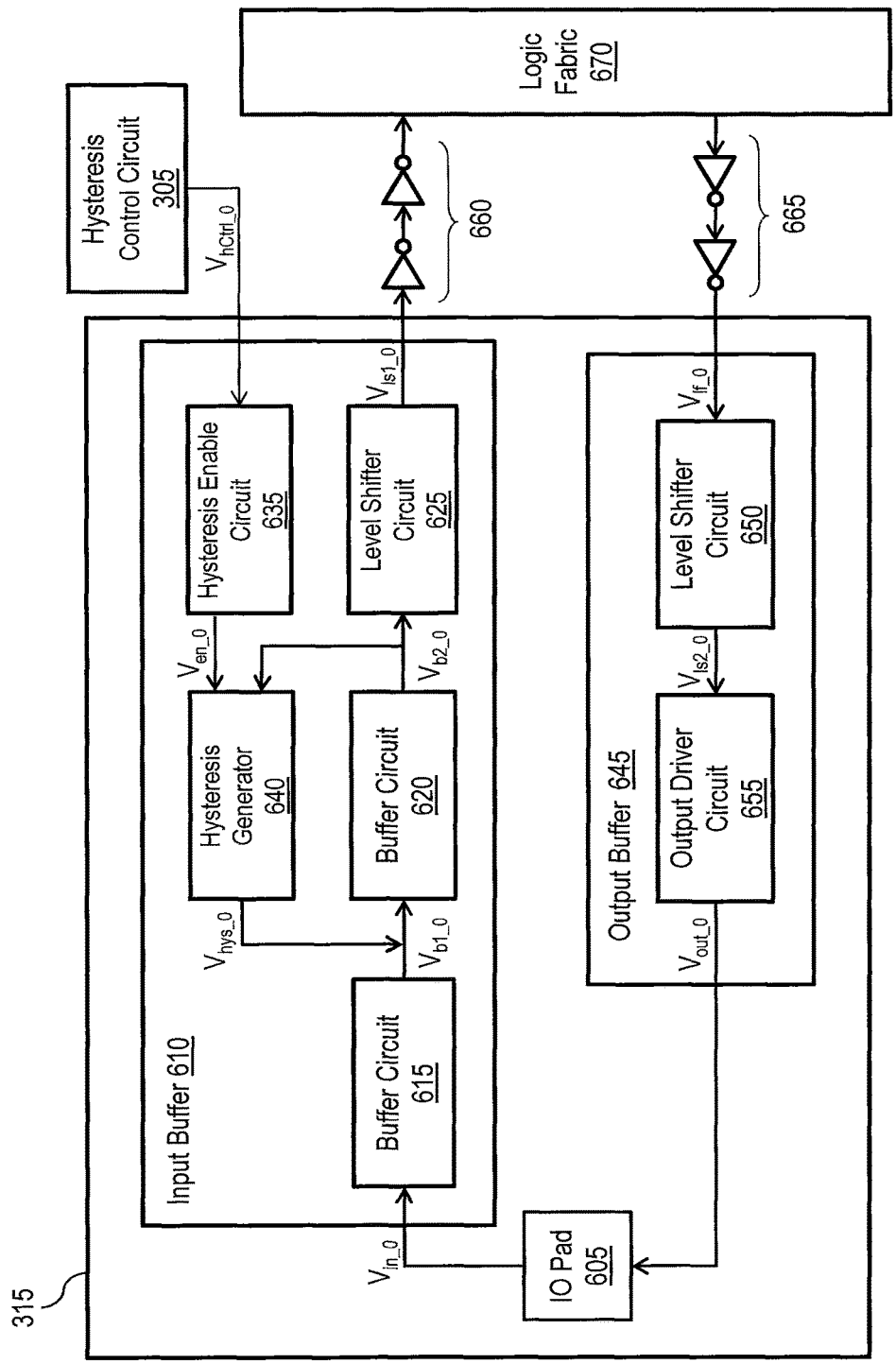
FIG. 6 illustrates an example of a block diagram of an input/output cell for providing input/output functionality of a PLD in accordance with an embodiment of the disclosure.

FIG. 6 illustrates an example of a block diagram of the I/O cell 315 for providing I/O functionality in accordance with an embodiment of the disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The I/O cell 315 includes an I/O pad 605, an input buffer 610, and an output buffer 645. The I/O pad 605 may be coupled to a logic fabric 670 via an output path or an input path. In an aspect, the logic fabric 670 may be provided by the logic core 225 of FIG. 2. The input buffer 610 includes a buffer circuit 615, a buffer circuit 620, a level-shifter circuit 625, a hysteresis enable circuit 635, and a hysteresis generator 640. The output buffer 645 includes a level-shifter circuit 650 and an output driver circuit 655. In some aspects, the buffer circuit 615, buffer circuit 620, level-shifter circuit 625, hysteresis enable circuit 635, and hysteresis generator 640 are tied to a rail (e.g., not shown in FIG. 6) that provides the I/O voltage $V_{CCIO\_0}$.

On the input path, the I/O pad 605 may receive signals from an external component connected to the I/O cell 315 (e.g., an external component connected to a PLD that includes the I/O cell 315). In FIG. 6, the I/O pad 605 may receive a voltage signal (e.g., from an external component) and provide the voltage signal as an input voltage $V_{in\_0}$. The buffer circuit 615 may buffer the input voltage $V_{in\_0}$ to provide a voltage $V_{b1\_0}$. The buffer circuit 620 may receive the voltage $V_{b1\_0}$ and provide a voltage $V_{b2\_0}$ based on the voltage $V_{b1\_0}$ and the hysteresis voltage $V_{hys\_0}$. The voltages $V_{b1\_0}$ and $V_{b2\_0}$ may be referred to as buffer voltages.

The buffer circuit 620 may provide the voltage $V_{b2\_0}$ to the level-shifter circuit 625 as well as to the hysteresis generator 640 via a feedback path. The level-shifter circuit 625 may receive the voltage $V_{b2\_0}$ from the buffer circuit 620 and process the voltage $V_{b2\_0}$ to shift the voltage $V_{b2\_0}$ to a voltage $V_{ls1\_0}$ that is at a voltage level appropriate for the logic fabric 670. The voltage $V_{ls1\_0}$ may be referred to as a level-shifted voltage or a logic block voltage. In this regard, the level-shifter circuit 625 may convert the voltage $V_{b2\_0}$ from voltage levels based on the I/O voltage $V_{CCIO\_0}$ to voltage levels based on the core voltage $V_{CC}$. The buffer 660 may buffer and provide the voltage $V_{Is1\_0}$ to the logic fabric 670.

With regard to the feedback path, the hysteresis voltage $V_{hys\_0}$ may be applied at an input of the buffer circuit 620 to adjust one or more trip points of the buffer circuit 620. In some cases, relative to a case in which the trip point is $V_{CCIO\_0}/2$ (where $V_{CCIO\_0}$ is the I/O voltage for the I/O cell 315) for both a low-to-high transition voltage $V_{L2H}$ and high-to-low transition voltage $V_{H2L}$ of the buffer circuit 620, the hysteresis voltage $V_{hys\_0}$ may cause a difference between the low-to-high transition voltage and the high-to-low transition voltage. In some cases, the hysteresis voltage $V_{hys\_0}$ may cause the low-to-high transition voltage to be higher than $V_{CCIO\_0}/2$ and/or the high-to-low transition voltage to be lower than $V_{CCIO\_0}/2$. In some aspects, the hysteresis voltage $V_{hys\_0}$ may be utilized to mitigate system noise and/or fluctuations in the $V_{CCIO\_0}$ and/or $V_{CC}$ levels.

The hysteresis enable circuit 635 may receive the hysteresis control voltage $V_{hCtrl\_0}$ from the hysteresis control circuit 305 and generate an enable voltage $V_{en\_0}$ for the hysteresis generator 640. The hysteresis generator 640 may generate the hysteresis voltage $V_{hys\_0}$ based on the I/O voltage $V_{CCIO\_0}$, enable voltage $V_{en\_0}$, and feedback of the voltage $V_{b2\_0}$ output by the buffer circuit 620.

In some aspects, the hysteresis generator 640 may include one or more hysteresis generating circuits (e.g., also referred to simply as hysteresis circuits). In some cases, a subset of the hysteresis generating circuits may generally be turned on during operation of the PLD (e.g., independent of the enable voltage $V_{en\_0}$), such that some amount of hysteresis voltage is applied to mitigate system noise and/or power supply fluctuations, whereas another subset of the hysteresis generating circuits may be selectively turned on or off based on the enable voltage $V_{en\_0}$. For example, hysteresis generating circuits may be selectively turned on or off to configure a hysteresis voltage applied to the input of the buffer circuit 620. Although a single enable voltage $V_{en\_0}$ is depicted in FIG. 6, in an embodiment multiple enable voltages may be utilized. For example, each enable voltage (e.g., $V_{enA\_0}$, $V_{enB\_0}$, etc.) may be utilized to selectively turn on or off one or more hysteresis generating circuits. In some cases, the hysteresis generating circuits may be Schmitt trigger circuits.

As an example, the hysteresis generator 640 may include two hysteresis generating circuits. A first hysteresis generating circuit may be independent of the enable voltage $V_{en\_0}$. For example, the first hysteresis generating circuit may apply a hysteresis voltage $V_{hysA\_0}$ to the input of the buffer circuit 620 regardless of whether the enable voltage $V_{en\_0}$ is a logic high or logic low. A second hysteresis generating circuit may be turned on or off based on a state of the enable voltage $V_{en\_0}$. For example, the second hysteresis generating circuit may apply no hysteresis voltage if the enable voltage $V_{en\_0}$ is at logic low and apply a hysteresis voltage $V_{hysB\_0}$ to the input of the buffer circuit 620 if the enable voltage $V_{en\_0}$ is at logic high.

In some aspects, on the output path, after configuration of a PLD (e.g., 200) that includes the I/O cell 315, the logic fabric 670 may provide a signal having a voltage based on the core voltage $V_{CC}$ to the output buffer 645 via a buffer 665. The level-shifter circuit 650 may receive a voltage $V_{if\_0}$ from the buffer 665 and shift the voltage $V_{If\_0}$ to a voltage $V_{Is2\_0}$ that is at a voltage level appropriate for the I/O cell 315. In this regard, the level-shifter circuit 650 may convert the voltage $V_{If\_0}$ from voltage levels based on the core voltage $V_{CC}$ to voltage levels based on the I/O voltage $V_{CCIO\_0}$. The output driver circuit 655 may generate a voltage $V_{out\_0}$ and drive the voltage $V_{out\_0}$ onto the I/O pad 605. In some cases, the output driver circuit 655 may include one or more pre-driver circuits connected to the level-shifter circuit 650 and one or more driver circuits connected between the I/O pad 605 and the pre-driver circuit(s).

As an example, the I/O pad 605 may be coupled to a component (e.g., a fan, an LED) controlled by the I/O fabric of a PLD that includes the I/O cell 315. When a value of 0 (e.g., converted to a logic low) is driven onto the I/O pad 605 by the output driver circuit 655, the component may be off (e.g., turned off if the component is turned on or remain off if the component is already off). When a value of 1 (e.g., converted to a logic high) is driven onto the I/O pad 605, the component may be on (e.g., turned on if the component is turned off or remain on if the component is already on).

Figure 7:
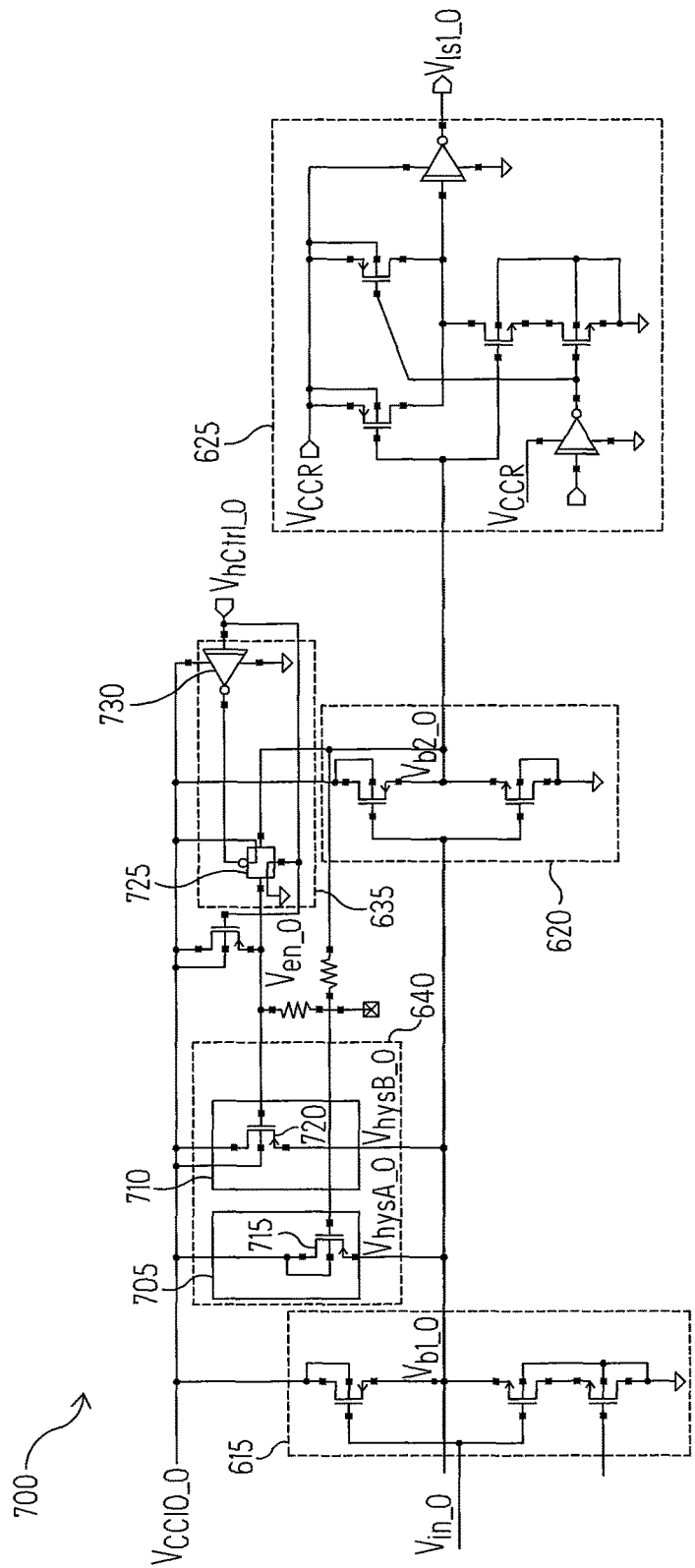
FIG. 7 illustrates an example implementation of a portion of an input path of an input/output cell of a PLD in accordance with an embodiment of the disclosure.

FIG. 7 illustrates an example implementation of a portion 700 of the input path of the I/O cell 315 in accordance with an embodiment of the disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. For example, the portion 700 may include protection circuitry, dummy circuitry, and/or pull-up circuitry not shown in FIG. 7.

The portion 700 includes the buffer circuit 615, buffer circuit 620, level-shifter circuit 625, hysteresis enable circuit 635, and hysteresis generator 640. The description of FIG. 6 generally applies to FIG. 7, with examples of differences and other description provided herein.

The buffer circuit 615 may buffer the input voltage $V_{in\_0}$ received from an I/O pad (e.g., the I/O pad 605) and provide the voltage $V_{b1\_0}$. The buffer circuit 615 may provide the voltage $V_{b1\_0}$ to the buffer circuit 620. The buffer circuit 620 may receive the voltage $V_{b1\_0}$ and provide the voltage $V_{b2\_0}$ based on the voltage $V_{b1\_0}$ and hysteresis voltages $V_{hysA\_0}$ and $V_{hysB\_0}$. The buffer circuit 620 may provide the voltage $V_{b2\_0}$ to the level-shifter circuit 625 as well as to the hysteresis generator 640 via feedback paths. The level-shifter circuit 625 may shift the voltage $V_{b2\_0}$ from the buffer circuit 620 to a voltage $V_{Is1\_0}$ that is at a voltage level appropriate for a logic fabric (e.g., the logic fabric 670 of FIG. 6). In this regard, the level-shifter circuit 625 may convert the voltage $V_{b2\_0}$ from voltage levels based on the I/O voltage $V_{CCIO\_0}$ to voltage levels based on the core voltage $V_{CC}$.

The hysteresis generator 640 includes a hysteresis circuit 705 and a hysteresis circuit 710. In some aspects, the hysteresis circuits 705 and 710 may be Schmitt trigger circuits. The hysteresis circuit 705 includes a transistor 715 that receives (e.g., at its drain) the I/O voltage $V_{CCIO\_0}$. A gate of the transistor 715 is coupled to an output of the buffer circuit 620. The voltage $V_{b2\_0}$ output by the buffer circuit 620 is fed back to the hysteresis circuit 705 (e.g., a gate of the hysteresis circuit 705). A source of the transistor 715 is connected to an output of the buffer circuit 615 and an input of the buffer circuit 620. The feedback from the buffer circuit 620 to the transistor 715 may turn on the transistor 715 and cause the I/O voltage $V_{CCIO\_0}$ to couple to the input of the buffer circuit 620. In this regard, the hysteresis circuit 705 may apply the hysteresis voltage $V_{hysA\_0}$ to the input of the buffer circuit 620.

The hysteresis voltage $V_{hysA\_0}$ may adjust the low-to-high trip point voltage level $V_{L2H}$ and high-to-low trip point voltage level $V_{H2L}$ of the buffer circuit 620, relative to the case when no hysteresis is applied to the input of the buffer circuit 620. For example, without hysteresis, $V_{L2H}=V_{H2L}=V_{CCIO\_0}/2$. In this example, for FIG. 7, the hysteresis circuit 705 may cause a transition from low-to-high to occur later (e.g., relative to a case without hysteresis applied), which corresponds to an increase in the low-to-high trip voltage level $V_{L2H}$ such that $V_{L2H}>V_{CCIO\_0}/2$, and cause a transition from high-to-low to occur later, which corresponds to a decrease in the high-to-low trip voltage level $V_{H2L}$ such that $V_{H2L}<V_{CCIO\_0}/2$. In FIG. 7, the hysteresis voltage $V_{hysA\_0}$ (e.g., and similarly the difference in $V_{L2H}$ and $V_{H2L}$) may be based on a value of the I/O voltage $V_{CCIO\_0}$ utilized for the I/O cell 315.

The hysteresis circuit 710 includes a transistor 720 that receives (e.g., at its drain) the I/O voltage $V_{CCIO\_0}$. In an aspect, the hysteresis circuit 710 may be referred to as a ratioed hysteresis circuit. In this regard, the hysteresis provided by the hysteresis circuit 710 may be a function of a ratio of a size of the transistor 720 (e.g., also referred to as a feedback pull-up transistor) to a size of a pull-down NMOS of the buffer circuit 615. The transistor 720 is selectively turned on or off based on the enable signal $V_{en\_0}$ from the hysteresis enable circuit 635. A gate of the transistor 720 is selectively coupled to the output of the buffer circuit 620 via the hysteresis enable circuit 635. In FIG. 7, the gate of the transistor 720 is selectively coupled to the output of the buffer circuit 620 via a multiplexer 725 of the hysteresis enable circuit 635. A source of the transistor 720 is connected to the output of the buffer circuit 615 and the input of the buffer circuit 620.

When the hysteresis enable circuit 635 blocks feedback from the output of the buffer circuit 620 to the transistor 720 (e.g., $V_{en\_0}$ is at logic low), the hysteresis circuit 710 (e.g., the transistor 720) is turned off and the I/O voltage $V_{CCIO\_0}$ is decoupled from the input of the buffer circuit 620. In this case, no hysteresis voltage $V_{hysB\_0}$ is applied by the hysteresis circuit 710 at the input of the buffer circuit 620. As such, the hysteresis circuit 710 does not contribute to the hysteresis applied by the hysteresis generator 640 to the input of the buffer circuit 620, and thus the hysteresis circuit 710 does not adjust the trip points (e.g., $V_{H2L}$, $V_{L2H}$) of the buffer circuit 620.

When the hysteresis enable circuit 635 allows feedback from the output of the buffer circuit 620 to the transistor 720 (e.g., $V_{en\_0}$ is at logic high), the feedback from the buffer circuit 620 to the transistor 720 is selected as the enable signal $V_{en\_0}$ and may turn on the transistor 720 and cause the I/O voltage $V_{CCIO\_0}$ to couple to the input of the buffer circuit 620. In this case, the hysteresis circuit 710 may apply the hysteresis voltage $V_{hysB\_0}$ to the input of the buffer circuit 620. The hysteresis circuit 710 may cause an increase in the low-to-high trip voltage level $V_{L2H}$ and a decrease in the high-to-low trip voltage level $V_{H2L}$. In some aspects, such as in FIG. 7, an adjustment in the trip points contributed by the hysteresis circuit 710 via the hysteresis voltage $V_{hysB\_0}$ is in addition to an adjustment in the trip points contributed by the hysteresis circuit 705 via the hysteresis voltage $V_{hysA\_0}$. In FIG. 7, the hysteresis voltage $V_{hysB\_0}$ (e.g., and similarly the difference in $V_{L2H}$ and $V_{H2L}$) may be based on the value of the I/O voltage $V_{CCIO\_0}$ utilized for the I/O cell 315. In some cases, the hysteresis voltage $V_{hysB\_0}$ (when the hysteresis circuit 710 is turned on) is larger than the hysteresis voltage $V_{hysA\_0}$. In some embodiments, product specifications may specify minimum and/or maximum hysteresis level to be generated and applied by the hysteresis generator 640 for different technologies and/or different $V_{CCIO}$ values (e.g., LVCMOS33, LVCMOS18, etc.).

As an example, the hysteresis voltage $V_{hysA\_0}$ may approximately between 20 mV and 30 mV when $V_{CCIO\_0}$ is 1.2 V. As an example, the hysteresis voltage $V_{hysB\_0}$ may be approximately between 150 mV and 200 mV. In this example, the hysteresis voltage $V_{hysB\_0}$ may be around 150 mV when the I/O voltage $V_{CCIO\_0}$ is 1.8 V, around 175 mV when the I/O voltage $V_{CCIO\_0}$ is 2.5 V, and around 200 mV when the I/O voltage $V_{CCIO\_0}$ is 3.3 V. In this regard, the hysteresis circuits 705 and 710 may be referred to as a small hysteresis circuit and a large hysteresis circuit, respectively. In these examples, the hysteresis voltage $V_{hys\_0}$ is generally dominated by the hysteresis voltage $V_{hysB\_0}$ for $V_{CCIO\_0}$ levels of 1.8 V and above.

The hysteresis enable circuit 635 includes the multiplexer 725 and an inverter 730. The inverter 730 receives the hysteresis control signal $V_{hCtrl\_0}$ (e.g., from the hysteresis control circuit 305 of FIG. 3). When an output of the inverter 730 is at logic low (e.g., $V_{hCtrl\_0}$ is at logic high), the multiplexer 725 may couple the output of the buffer circuit 620 (e.g., the voltage $V_{b2\_0}$) to the transistor 720 to turn on the transistor 720. When an output of the inverter 730 is a logic high (e.g., $V_{hCtrl\_0}$ is a logic low), the multiplexer 725 may block the output of the buffer circuit 620 from the transistor 720 to turn off the transistor 720.

Thus, in FIG. 7, the hysteresis generator 640 provides a multistage hysteresis circuit. During operation of the I/O cell 315 (e.g., when the I/O cell 315 is powered by the I/O voltage $V_{CCIO\_0}$), the hysteresis circuit 710 may be selectively turned on (e.g., activated) or turned off (e.g., deactivated, not activated) in response to the enable voltage $V_{en\_0}$ from the hysteresis enable circuit 635. The hysteresis circuit 705 generally remains on such that the hysteresis voltage $V_{hysA\_0}$ is applied to the input of the buffer circuit 620 independent of the enable voltage $V_{en\_0}$. As previously described with regard to FIG. 5 for example, in some embodiments, the hysteresis control circuit $V_{hCtrl\_0}$ may be at logic high when $V_{CCIO\_0}>V_{CC}$ and logic low when $V_{CCIO\_0} \leq V_{CC}$. In these cases, the small hysteresis circuit implemented by the hysteresis circuit 705 may provide a small amount of hysteresis to the buffer circuit 620 for any value of $V_{CCIO\_0}$, whereas the large hysteresis circuit implemented by the large hysteresis circuit 710 may provide a larger amount of hysteresis to the buffer circuit 620 when $V_{CCIO\_0}>V_{CC}$. For $V_{CCIO\_0}>V_{CC}$, the hysteresis generator 640 provides the hysteresis voltage $V_{hys\_0}=V_{hysA\_0}+V_{hysB\_0}$. In some aspects, the hysteresis voltage $V_{hys\_0}$ is generally dominated by the hysteresis voltage $V_{hysB\_0}$ for $V_{CCIO\_0}$ levels of 1.8 V and above.

Although FIG. 7 illustrates a hysteresis generator with two hysteresis stages, in some embodiments a hysteresis generator with fewer or more hysteresis stages may be utilized. A hysteresis generator may have one or more hysteresis stages that are generally turned on during operation (e.g., the hysteresis circuit 705) and/or one or more hysteresis stages that are selectively turned on or off based on a state (e.g., logic high, logic low) of a corresponding one or more enable signals. Hysteresis circuits may be implemented using Schmitt trigger circuits or other circuit appropriate for providing hysteresis to an input buffer of an I/O cell.

Figure 8:
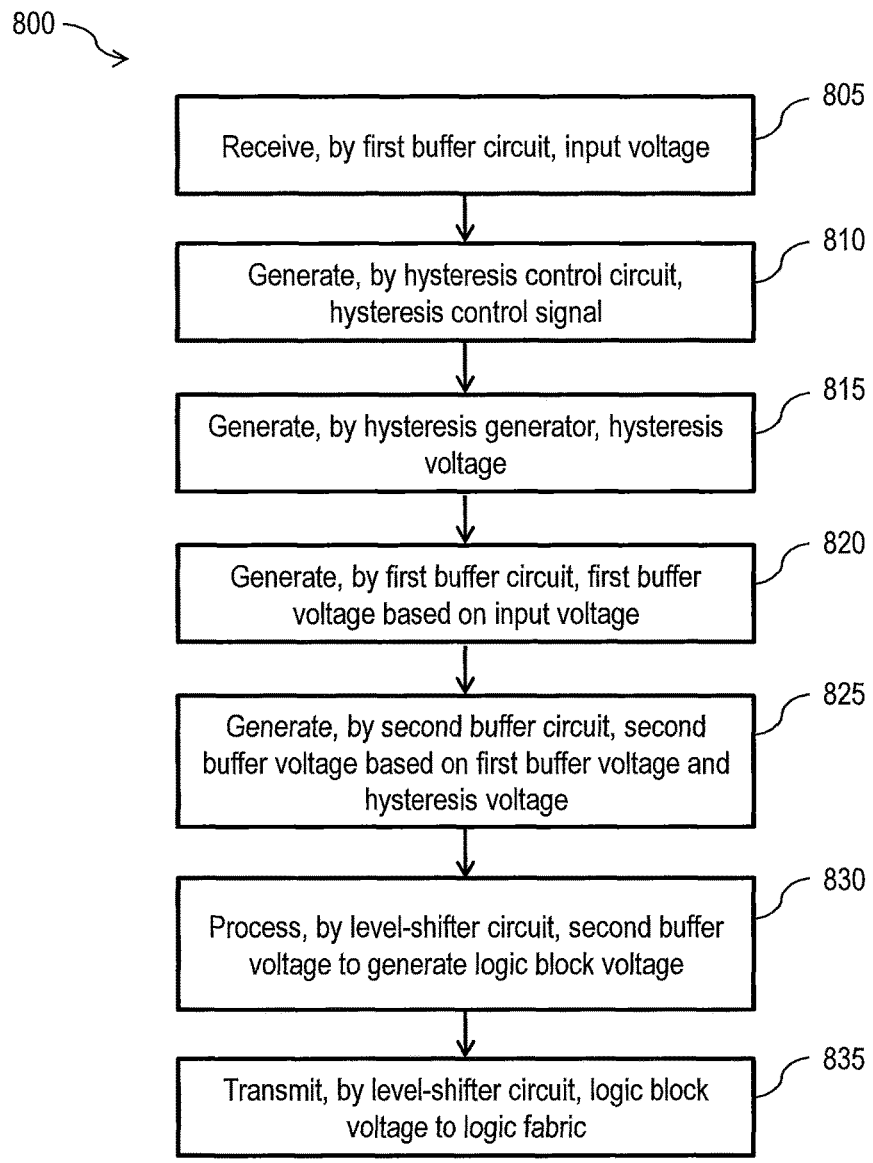
FIG. 8 illustrates a flow diagram of an example process for facilitating hysteresis control for an input/output cell of a PLD in accordance with an embodiment of the disclosure.

FIG. 8 illustrates a flow diagram of an example process 800 for facilitating hysteresis control for an I/O cell of a PLD in accordance with an embodiment of the disclosure. In an embodiment, the hysteresis control may involve generating a hysteresis voltage and applying the hysteresis voltage to an input buffer (e.g., 610) of the I/O cell. Note that one or more operations may be combined, omitted, and/or performed in a different order as desired. For discussion purposes, the process 800 is described with reference to the I/O cell 315 and associated circuitry provided in FIGS. 3-7. However, the process 800 may be utilized with other I/O cells and associated circuitry.

At block 805, the buffer circuit 615 of the I/O cell 315 receives the input voltage $V_{in\_0}$. The I/O cell may be operated (e.g., powered) using the I/O voltage $V_{CCIO\_0}$. The I/O cell 315 may be a part of the I/O bank 310, which may in turn be part of the I/O fabric of a PLD (e.g., 200). In some cases, the input voltage $V_{in\_0}$ may be received via the I/O pad 605 from an external device coupled to the I/O pad 605.

At block 810, the hysteresis control circuit 305 generates the hysteresis control signal $V_{hCtrl\_0}$. In an aspect, the hysteresis control signal $V_{hCtrl\_0}$ may be generated based on the core voltage $V_{CC}$ and the I/O voltage $V_{CCIO\_0}$. For example, the hysteresis control circuit 305 may include a comparator (e.g., the comparator 405) that compares the core voltage $V_{CC}$ to the I/O voltage $V_{CCIO\_0}$ to provide the comparator output voltage $V_{comp\_0}$. In an aspect, the hysteresis control circuit 305 may select (e.g., using the multiplexer 410) the comparator output voltage $V_{comp\_0}$ or the hysteresis enable voltage $V_{hEnable\_0}$ as the hysteresis control signal $V_{hCtrl\_0}$. In such an aspect, the hysteresis control circuit 305 may be based on one or more of select the comparator output voltage $V_{comp\_0}$, hysteresis enable voltage $V_{hEnable\_0}$, and selection signal $S_0$. In one case, the hysteresis control signal $V_{hCtrl\_0}$ may be at logic high when $V_{CCIO\_0} > V_{CC}$ and at logic low when $V_{CCIO\_0} \leq V_{CC}$. In some aspects, the multiplexer 410 and associated signals (e.g., $V_{hEnable\_0}$, $S_0$) are optional and may be omitted from the hysteresis control circuit 305.

At block 815, the hysteresis generator 640 generates the hysteresis voltage $V_{hys\_0}$ based on the hysteresis control signal and the I/O voltage $V_{CCIO}$. The hysteresis voltage $V_{hys\_0}$ may be applied to the input of the buffer circuit 620. In an aspect, the hysteresis generator 640 may include one or more hysteresis generating circuits. In one example, the hysteresis generator 640 may include a first hysteresis generating circuit that generates the hysteresis voltage $V_{hysA\_0}$ based on the I/O voltage $V_{CCIO\_0}$ and the voltage provided as feedback from the buffer circuit 620. The first hysteresis generating circuit may generally be turned on during operation of the I/O cell 315. For example, the first hysteresis generating circuit may effectively be always turned on during operation of the I/O cell 315, such as to provide a relatively small hysteresis voltage (e.g., 25 mV).

The hysteresis generator 640 may further include a second hysteresis generating circuit that may be turned on or off based on the enable voltage $V_{en\_0}$ from the hysteresis enable circuit 635. In some cases, the enable voltage $V_{en\_0}$ may be based on the hysteresis control signal $V_{hCtrl\_0}$ from the hysteresis control circuit 305. In an aspect, the second hysteresis generating circuit may be turned on to generate the hysteresis voltage $V_{hysB\_0}$ if $V_{CCIO\_0} > V_{CC}$ and turned off to provide no hysteresis if $V_{CCIO\_0} \leq V_{CC}$. When the second hysteresis generating circuit is turned on, the hysteresis voltage $V_{hysB\_0}$ may be larger than the hysteresis voltage $V_{hysA\_0}$. For example, the hysteresis voltage $V_{hysA\_0}$ may be approximately between 20 and 30 mV whereas the hysteresis voltage $V_{hysB\_0}$ may be approximately between 150 mV and 200 mV. In an aspect, the hysteresis voltages $V_{hysA\_0}$ and $V_{hysB\_0}$ may each scale with the I/O voltage $V_{CCIO\_0}$. For example, larger voltage levels for $V_{CCIO\_0}$ may be associated with higher hysteresis voltages $V_{hysA\_0}$ and $V_{hysB\_0}$.

Each of the hysteresis voltages $V_{hysA\_0}$ and $V_{hysB\_0}$ may be directly proportional to the I/O voltage $V_{CCIO\_0}$.

At block 820, the buffer circuit 615 generates the buffer voltage $V_{b1\_0}$ based on the input voltage $V_{in\_0}$. At block 825, the buffer circuit 620 generates the buffer voltage $V_{b2\_0}$ based on the buffer voltage $V_{b1\_0}$ and the hysteresis voltage $V_{hys\_0}$. In some cases, without hysteresis, the low-to-high and high-to-low trip points of the buffer circuit 620 may be at $V_{CCIO}/2$. With the hysteresis voltage $V_{hys\_0}$ applied at the input to the buffer circuit 620, the low-to-high trip point $V_{L2H}$ may be higher than $V_{CCIO}/2$ and/or the high-to-low trip point $V_{H2L}$ may be less than $V_{CCIO}/2$. The buffer circuit 620 may transmit the buffer voltage $V_{b2\_0}$ to the level-shifter circuit 625 and, via one or more feedback paths, to the hysteresis generator 640.

At block 830, the level-shifter circuit 625 processes the buffer voltage $V_{b2\_0}$ to generate the logic block voltage $V_{ls1\_0}$. For example, the level-shifter circuit 625 may convert the buffer voltage $V_{b2\_0}$ from voltage levels based on the I/O voltage $V_{CCIO\_0}$ to voltage levels based on the core voltage $V_{CC}$. At block 835, the level-shifter circuit 625 transmits the logic block voltage $V_{ls1\_0}$ to the logic fabric 670 of the PLD. For example, the level-shifter circuit 625 may transmit the logic block voltage $V_{ls1\_0}$ to the buffer 660 and the buffer 660 may buffer and provide the logic block voltage $V_{ls1\_0}$ to the logic fabric 670.

Figure 9:
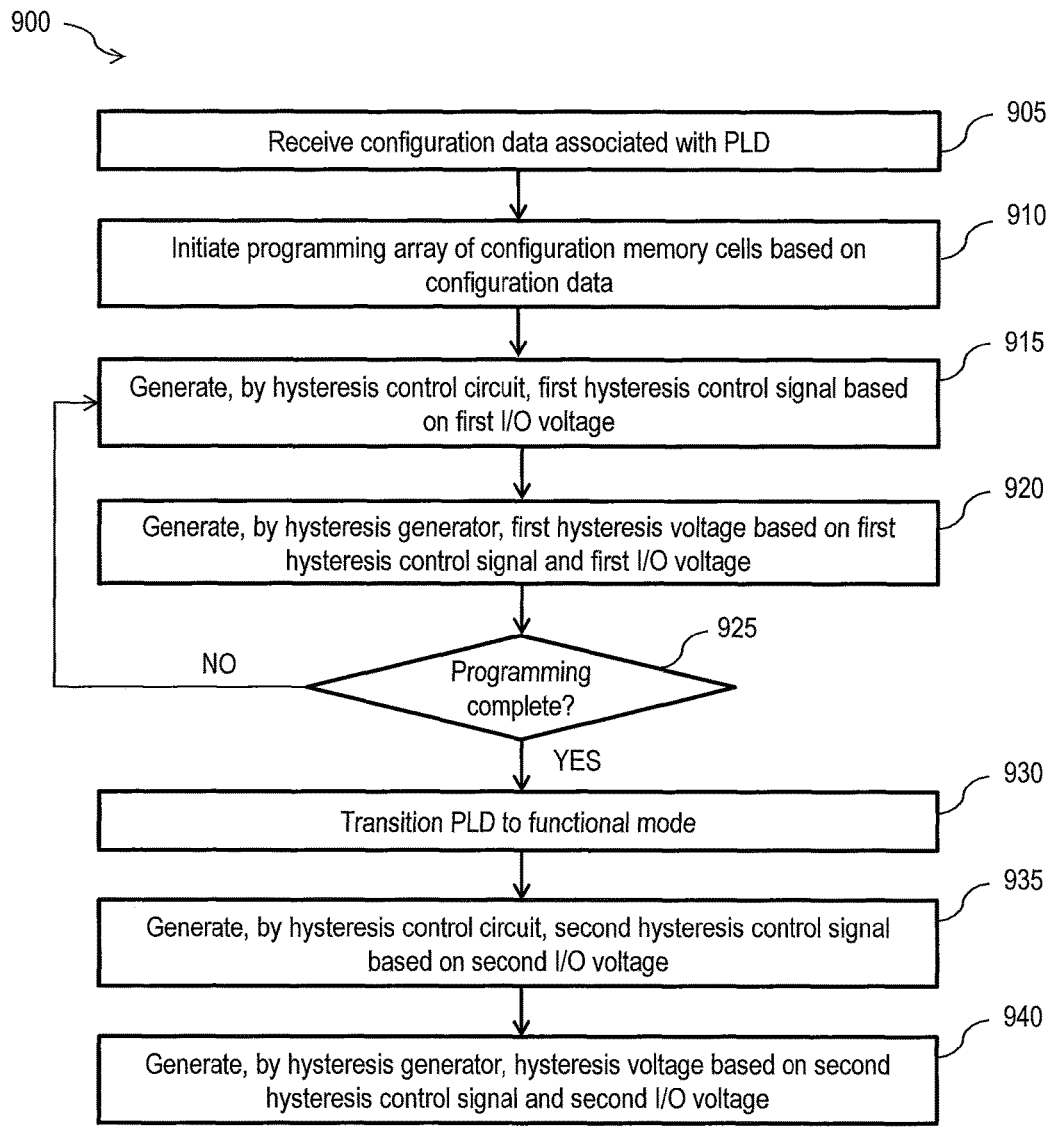
FIG. 9 illustrates a flow diagram of an example process for facilitating hysteresis control for an input/output cell of a PLD during configuration and after configuration of the PLD in accordance with an embodiment of the disclosure.

FIG. 9 illustrates a flow diagram of an example process 900 for facilitating hysteresis control for an I/O cell of a PLD during configuration and after configuration of the PLD in accordance with an embodiment of the disclosure. Note that one or more operations may be combined, omitted, and/or performed in a different order as desired. For discussion purposes, the process 900 is described with reference to the I/O cell 315 and associated circuitry provided in FIGS. 2-7. However, the process 900 may be utilized with other I/O cells and associated circuitry.

At block 905, the processing circuit 230 receives configuration data associated with the PLD 200. The configuration data may be generated by the external system 130. In an aspect, the processing circuit 230 may obtain the configuration data from non-volatile memory of the PLD 200 (e.g., loaded into the non-volatile memory by the external system 130) that is in the PLD 200 and/or external to the PLD 200. The processing circuit 230 may receive the configuration data as part of a bitstream.

At block 910, the processing circuit 230 initiates programming of an array of configuration memory cells of the PLD 200 based on the configuration data. In this regard, the I/O cell 315 and the PLD 200 may be referred to as being in the configuration mode of the PLD 200. Blocks 915 and 920 may be performed during programming of the array. At blocks 915, the hysteresis control circuit 305 generates a hysteresis control signal $V_{hCtrl\_0}$ based on an I/O voltage $V_{CCIO1\_0}$ for the I/O cell 315 during the configuration mode of the PLD 200. In some cases, the hysteresis control signal $V_{hCtrl\_0}$ may be based on the I/O voltage $V_{CCIO1\_0}$ and the core voltage $V_{CC}$. At block 920, the hysteresis generator 640 generates a hysteresis voltage $V_{hys1\_0}$ based on the hysteresis control signal $V_{hCtrl1\_0}$ and I/O voltage $V_{CCIO1\_0}$. The hysteresis voltage $V_{hys1\_0}$ may be applied to the input of the buffer circuit 620 as data is received by the input buffer 610 via the I/O pad 605 while the PLD 200 is in the configuration mode.

At block 925, the processing circuit 230 determines whether programming of the array is complete. If the programming is determined to not be complete, the process proceeds to block 915. If the programming is determined to be complete, the process proceeds to block 930. At block 930, the processing circuit 230 transitions the PLD 200 from the configuration mode to the functional mode. For example, the wakeup circuit 245 of the processing circuit 230 may provide a wakeup signal to activate functionality of the PLD 200 to transition the PLD 200 from the configuration mode to the functional mode.

At blocks 935, the hysteresis control circuit 305 generates a hysteresis control signal $V_{hCtrl2\_0}$ based on an I/O voltage $V_{CCIO2\_0}$ for the I/O cell 315. The I/O voltage $V_{CCIO2\_0}$ may be the same or may be different from the I/O voltage $V_{CCIO1\_0}$ (e.g., used during the configuration mode). The hysteresis control signal $V_{hCtrl2\_0}$ may be based on the I/O voltage $V_{CCIO2\_0}$ and the core voltage $V_{CC}$. In some cases, one of a comparator output voltage or a hysteresis enable signal may be selected as the hysteresis control signal. For example, the hysteresis enable signal $V_{hEnable\_0}$ and/or selection signal $S_0$ for operating the multiplexer 410 may be provided as part of the configuration data. At block 940, the hysteresis generator 640 generates a hysteresis voltage $V_{hys2\_0}$ based on the hysteresis control signal $V_{hCtrl2\_0}$ and I/O voltage $V_{CCIO2\_0}$. The hysteresis voltage $V_{hys2\_0}$ may be applied to the input of the buffer circuit 620 as data is received by the input buffer 610 via the I/O pad 605 while the PLD 200 is in the functional mode.

Although the foregoing describes various voltage, such as the hysteresis control voltage $V_{hCtrl\_0}$, hysteresis enable voltage $V_{hEnable\_0}$, and enable voltage $V_{en\_0}$, in some embodiments currents, optical signals, and/or generally any signal appropriate for conveying appropriate data or state (e.g., logic high, logic low) may be utilized together with or in place of voltages for facilitating hysteresis control.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

The invention claimed is:

1. A programmable logic device (PLD) comprising:
   a first hysteresis control circuit configured to generate a first hysteresis control signal based on a core voltage and a first input/output (I/O) voltage; and
   an I/O cell associated with an I/O fabric of the PLD and powered by the first I/O voltage, the I/O cell comprising:
   a first buffer circuit configured to receive a first input voltage and generate a first buffer voltage based on the first input voltage;
   a first hysteresis generator configured to generate a first hysteresis voltage based on the first hysteresis control signal and the first I/O voltage; and
   a second buffer circuit configured to generate a second buffer voltage based on the first buffer voltage and the first hysteresis voltage.

2. The PLD of claim 1, further comprising a processing circuit configured to:
   receive configuration data associated with the PLD; and
   program an array of configuration memory cells of the PLD based on the configuration data, the array of configuration memory cells comprising a plurality of logic block memory cells associated with a logic fabric of the PLD and a plurality of I/O block memory cells associated with the I/O fabric of the PLD,
   wherein during the programming of the array:
   the first hysteresis control circuit is configured to generate a second hysteresis control signal based on the core voltage and a second I/O voltage different from the first I/O voltage; and
   the first hysteresis generator is configured to generate a second hysteresis voltage based on the second hysteresis control signal and the second I/O voltage, wherein the second hysteresis voltage is different from the first hysteresis voltage; and
   wherein subsequent to the programming of the array:
   the first hysteresis control circuit is configured to generate the first hysteresis control signal; and
   the first hysteresis generator is configured to generate the first hysteresis voltage.

3. The PLD of claim 2, wherein the first hysteresis voltage is greater than the second hysteresis voltage if the first I/O voltage is greater than the second I/O voltage, and wherein the first hysteresis voltage is less than the second hysteresis voltage if the first I/O voltage is less than the second I/O voltage.

4. The PLD of claim 1, wherein the I/O cell further comprises a level-shifter circuit configured to:
   process the second buffer voltage based on the core voltage to generate a logic block voltage; and
   transmit the logic block voltage to a logic fabric of the PLD.

5. The PLD of claim 1, wherein the first hysteresis control circuit comprises a comparator configured to:
   compare the core voltage to the first I/O voltage; and
   generate a comparator output voltage based on comparison of the core voltage to the first I/O voltage, wherein the first hysteresis control signal is based at least on the comparator output voltage.

6. The PLD of claim 5, wherein the comparator comprises:
   a first plurality of transistors;
   a second plurality of transistors; and
   at least one buffer coupled to the first plurality of transistors and the second plurality of transistors,
   wherein the first plurality of transistors is configured to couple the first I/O voltage to an output terminal of the comparator via the at least one buffer, and
   wherein the second plurality of transistors is configured to couple the output terminal of the comparator to ground via the at least one buffer.

7. The PLD of claim 6, wherein:
the first plurality of transistors comprises a thick oxide transistor,
the second plurality of transistors comprises a thin oxide transistor,
a gate of the thin oxide transistor is configured to receive the core voltage,
a gate of the thick oxide transistor is configured to receive the first I/O voltage, and
a source of the thin oxide transistor is connected to a source of the thick oxide transistor.

8. The PLD of claim 5, wherein the first hysteresis control circuit further comprises a multiplexer configured to select the comparator output voltage as the first hysteresis control signal or a hysteresis enable signal as the first hysteresis control signal.

9. The PLD of claim 1, wherein the first hysteresis generator comprises:
a first hysteresis circuit configured to apply a first voltage to the second buffer circuit; and
a second hysteresis circuit configured to apply a second voltage to the second buffer circuit based on the first hysteresis control signal,
wherein the first hysteresis voltage is based on the first voltage and the second voltage.

10. The PLD of claim 9, further comprising a hysteresis enable circuit connected to the second hysteresis circuit, wherein the hysteresis enable circuit is configured to:
provide the second buffer voltage to the second hysteresis circuit if the first hysteresis control signal is in a first state; and
block the second buffer voltage from the second hysteresis circuit if the first hysteresis control signal is in a second state different from the first state,
wherein the second voltage is based on whether the second buffer voltage is provided to the second hysteresis circuit or blocked from the second hysteresis circuit.

11. The PLD of claim 10, wherein:
the second buffer circuit is configured to apply the second buffer voltage to the first hysteresis circuit and the hysteresis enable circuit,
the second hysteresis circuit is turned off if the second voltage is blocked from the second hysteresis circuit, and
the first voltage is less than the second voltage if the second buffer voltage is provided to the second hysteresis circuit.

12. The PLD of claim 1, wherein:
the I/O cell is a first I/O cell,
the I/O fabric of the PLD comprises a plurality of I/O cells,
each of the plurality of I/O cells is part of one of a plurality of I/O banks,
the first I/O cell is part of a first I/O bank of the plurality of I/O banks, and
the first hysteresis control circuit is configured to provide the first hysteresis control signal to each I/O cell of the first I/O bank.

13. The PLD of claim 12, further comprising:
a second hysteresis control circuit configured to generate a second hysteresis control signal based on the core voltage and a second I/O voltage, wherein the second I/O voltage is different from the first I/O voltage,
wherein a second I/O cell is part of a second I/O bank of the plurality of I/O banks, the second I/O cell comprising:

a second hysteresis generator configured to generate a second hysteresis voltage based on the second hysteresis control signal and the second I/O voltage, wherein the second hysteresis voltage is different from the first hysteresis voltage;
a third buffer circuit configured to receive a second input voltage and generate a third buffer voltage based on the second input voltage; and
a fourth buffer circuit configured to generate a fourth buffer voltage based on the third buffer voltage and the second hysteresis voltage.

14. A method comprising:
receiving, by a first buffer circuit of an input/output (I/O) cell, a first input voltage, wherein the I/O cell is powered by a first I/O voltage and is associated with an I/O fabric of a programmable logic device (PLD);
generating, by a hysteresis control circuit of the PLD, a first hysteresis control signal based on a core voltage and the first I/O voltage;
generating, by a hysteresis generator of the I/O cell, a first hysteresis voltage based on the first hysteresis control signal and the first I/O voltage;
generating, by the first buffer circuit, a first buffer voltage based on the first input voltage; and
generating, by a second buffer circuit of the I/O cell, a second buffer voltage based on the first buffer voltage and the first hysteresis voltage.

15. The method of claim 14, further comprising:
processing, by a level-shifter circuit, the second buffer voltage based on the core voltage to generate a logic block voltage; and
transmitting the logic block voltage to a logic fabric of the PLD.

16. The method of claim 14, wherein the generating the first hysteresis control signal comprises:
comparing, by a comparator of the hysteresis control circuit, the core voltage to the first I/O voltage; and
generating, by the comparator, a comparator output voltage based on the comparing, wherein the first hysteresis control signal is based at least on the comparator output voltage.

17. The method of claim 14, wherein the generating the first hysteresis voltage comprises:
applying, by a first hysteresis circuit of the hysteresis generator, a first voltage to the second buffer circuit; and
selectively applying, by a second hysteresis circuit of the hysteresis generator, a second voltage to the second buffer circuit in response to the first hysteresis control signal,
wherein:
the first voltage and the second voltage are based at least on the first I/O voltage, and
the first hysteresis voltage is based on the first voltage and the second voltage.

18. The method of claim 17, further comprising:
providing, by a hysteresis enable circuit of the PLD, the second buffer voltage to the second hysteresis circuit if the first hysteresis control signal is in a first state; and
blocking, by the hysteresis enable circuit, the second buffer voltage from the second hysteresis circuit if the first hysteresis control signal is in a second state different from the first state,
wherein the second voltage is based on whether the second buffer voltage is provided to the second hysteresis circuit or blocked from the second hysteresis circuit.

19. The method of claim 14, wherein:
the I/O cell is a first I/O cell,
the I/O fabric of the PLD comprises a plurality of I/O cells,
each of the plurality of I/O cells is part of one of a plurality of I/O banks,
the first I/O cell is part of a first I/O bank of the plurality of I/O banks, and
the hysteresis control circuit transmits the first hysteresis control signal to each I/O cell of the first I/O bank.

20. The method of claim 14, further comprising:
receiving configuration data associated with the PLD; and
programming an array of configuration memory cells of the PLD based on the configuration data, the array of configuration memory cells comprising a plurality of logic block memory cells associated with a logic fabric of the PLD and a plurality of I/O block memory cells associated with the I/O fabric of the PLD,
wherein during the programming:
  generating, by the hysteresis control circuit, a second hysteresis control signal based on the core voltage and a second I/O voltage different from the first I/O voltage; and
  generating, by the hysteresis generator, a second hysteresis voltage based on the second hysteresis control signal and the second I/O voltage, wherein the second hysteresis voltage is different from the first hysteresis voltage; and
wherein the generating the first hysteresis control signal and the generating the first hysteresis voltage are performed subsequent to the programming.

* * * * *